(12) United States Patent
Li et al.

(10) Patent No.: US 11,810,636 B2
(45) Date of Patent: Nov. 7, 2023

(54) LATCH ARRAY WITH MASK-WRITE FUNCTIONALITY

(71) Applicant: QUALCOMM Incorporated, San Diego, CA (US)

(72) Inventors: Rui Li, San Diego, CA (US); De Lu, San Diego, CA (US); Venkat Narayanan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/574,431

(22) Filed: Jan. 12, 2022

(65) Prior Publication Data

US 2023/0223054 A1 Jul. 13, 2023

(51) Int. Cl.
*G11C 7/10* (2006.01)

(52) U.S. Cl.
CPC .......... *G11C 7/1009* (2013.01); *G11C 7/1087* (2013.01)

(58) Field of Classification Search
CPC ............................. G11C 7/1009; G11C 7/1087
USPC ........................................................ 365/100
See application file for complete search history.

(56) References Cited

U.S. PATENT DOCUMENTS

| | | | |
|---|---|---|---|
| 5,539,696 A | 7/1996 | Patel | |
| 5,737,262 A * | 4/1998 | Morgan | G11C 8/00 365/100 |
| 5,999,441 A | 12/1999 | Runaldue et al. | |
| 6,469,949 B1 * | 10/2002 | Hsu | G11C 29/802 365/201 |
| 8,391,086 B2 | 3/2013 | Martinozzi et al. | |
| 8,848,429 B2 | 9/2014 | Vilangudipitchai et al. | |
| 2005/0141387 A1 * | 6/2005 | Cernea | G11C 29/848 369/100 |
| 2014/0226395 A1 | 8/2014 | Vilangudipitchai et al. | |
| 2019/0311751 A1 | 10/2019 | Yoo et al. | |

OTHER PUBLICATIONS

International Search Report and Written Opinion—PCT/US2022/053894—ISA/EPO—dated Apr. 6, 2023.

* cited by examiner

*Primary Examiner* — Huan Hoang
(74) *Attorney, Agent, or Firm* — Loza & Loza, LLP

(57) ABSTRACT

An aspect of the disclosure relates to a latch array, including: a first set of master latches including a first set of clock inputs configured to receive a master clock, a first set of data inputs configured to receive a first set of data, and a first set of data outputs coupled to a set of bitlines, respectively; a second set of master latches including a second set of clock inputs configured to receive the master clock, a first set of write-bit inputs configured to receive a set of write-bit signals, and a set of write-bit outputs coupled to a set of write-bit lines, respectively; and an array of slave latches, wherein the slave latches in columns of the array include a second set of data inputs coupled to the set of bitlines, and a second set of write-bit inputs coupled to the set of write-bit lines, respectively.

27 Claims, 8 Drawing Sheets

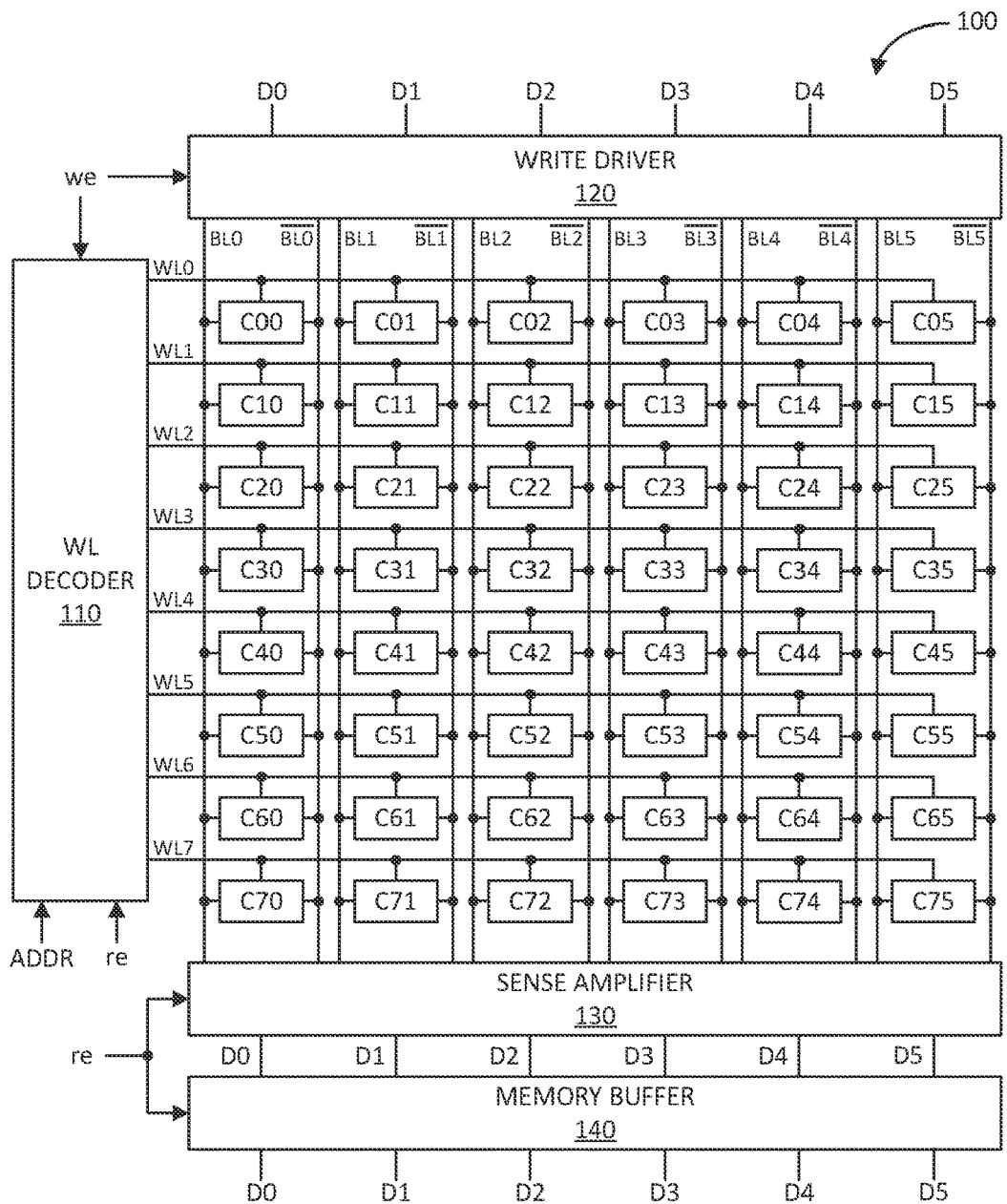
FIG. 1A
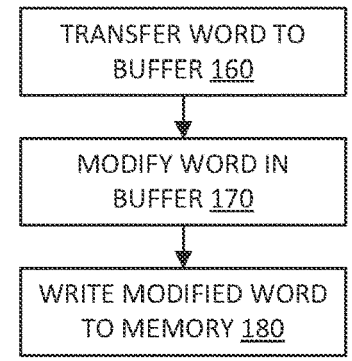
FIG. 1B
FIG. 1C

LATCH ARRAY WITH MASK-WRITE FUNCTIONALITY

FIELD

Aspects of the present disclosure relate generally to memory circuits, and in particular, to a latch array with mask-write functionality.

BACKGROUND

Static random access memories (SRAMs) and dynamic random access memories (DRAMs) are often employed in circuits, such as integrated circuits (ICs) including system on chip (SOC) type ICs. SRAM and DRAM memory circuits typically operate under a relatively high memory voltage domain to ensure that data transfer margins are met. Latch arrays, which also store data, are increasingly becoming popular because they typically operate under a relatively low logic voltage domain, which makes them much more power efficient than SRAMs and DRAMs. Thus, there has been a push to swap or replace SRAMs and DRAMs with latch arrays in the design of circuits, such as ICs and SOCs.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to a latch array. The latch array, includes a first set of master latches including a first set of clock inputs configured to receive a master clock, a first set of data inputs configured to receive a first set of data, and a first set of data outputs coupled to a set of bitlines, respectively; a second set of master latches including a second set of clock inputs configured to receive the master clock, a first set of write-bit inputs configured to receive a set of write-bit signals, and a set of write-bit outputs coupled to a set of write-bit lines, respectively; and an array of slave latches arranged into columns and rows, wherein the slave latches in the columns of the array include a second set of data inputs coupled to the set of bitlines, and a second set of write-bit inputs coupled to the set of write-bit lines, respectively.

Another aspect of the disclosure relates to a method. The method includes providing a deasserted write-bit signal to a target slave latch among a set of slave latches; providing a first set of data signals to the set of slave latches, respectively; providing a first slave clock to the set of slave latches to write data to one or more of the set of slave latches based on one or more of the first set of data signals, respectively; and operating the target slave latch to retain a previously stored data in response to the deasserted write-bit signal while the slave clock is causing the writing of data to the one or more of the set of slave latches based on the one or more of the first set of data signals, respectively.

Another aspect of the disclosure relates to an apparatus. The apparatus includes means for providing a deasserted write-bit signal to a target slave latch among a set of slave latches; means for providing a first set of data signals to the set of slave latches, respectively; means for providing a first slave clock to the set of slave latches to write data to one or more of the set of slave latches based on one or more of the first set of data signals, respectively; and means for operating the target slave latch to retain a previously stored data in response to the deasserted write-bit signal while the first slave clock is causing the writing of data to the one or more of the set of slave latches based on the one or more of the first set of data signals, respectively.

Another aspect of the disclosure relates to a wireless communication device. The wireless communication device includes at least one antenna; a transceiver coupled to the at least one antenna; one or more signal processing cores coupled to the transceiver; and a latch array coupled to the one or more signal processing cores, wherein the latch array includes: a first set of master latches including a first set of clock inputs configured to receive a master clock, a first set of data inputs configured to receive a set of data, respectively, and a first set of data outputs coupled to a set of bitlines, respectively; a second set of master latches including a second set of clock inputs configured to receive the master clock, a first set of write-bit inputs configured to receive a set of write-bit signals, and a set of write-bit outputs coupled to a set of write-bit lines, respectively; and an array of slave latches arranged into columns and rows, wherein the slave latches in the columns of the array include a second set of data inputs coupled to the set of bitlines, and a second set of write-bit inputs coupled to the set of write-bit lines, respectively.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF TILE DRAWINGS

FIG. 1A illustrates a block/schematic diagram of an example memory circuit in accordance with an aspect of the disclosure.

FIG. 1B illustrates a bit diagram of example data stored in the memory circuit of FIG. 1A in accordance with another aspect of the disclosure.

FIG. 1C illustrates a flow diagram of an example method of writing data into the memory circuit of FIG. 1A in accordance with another aspect of the disclosure.

DETAILED DESCRIPTION

Figure 2A:
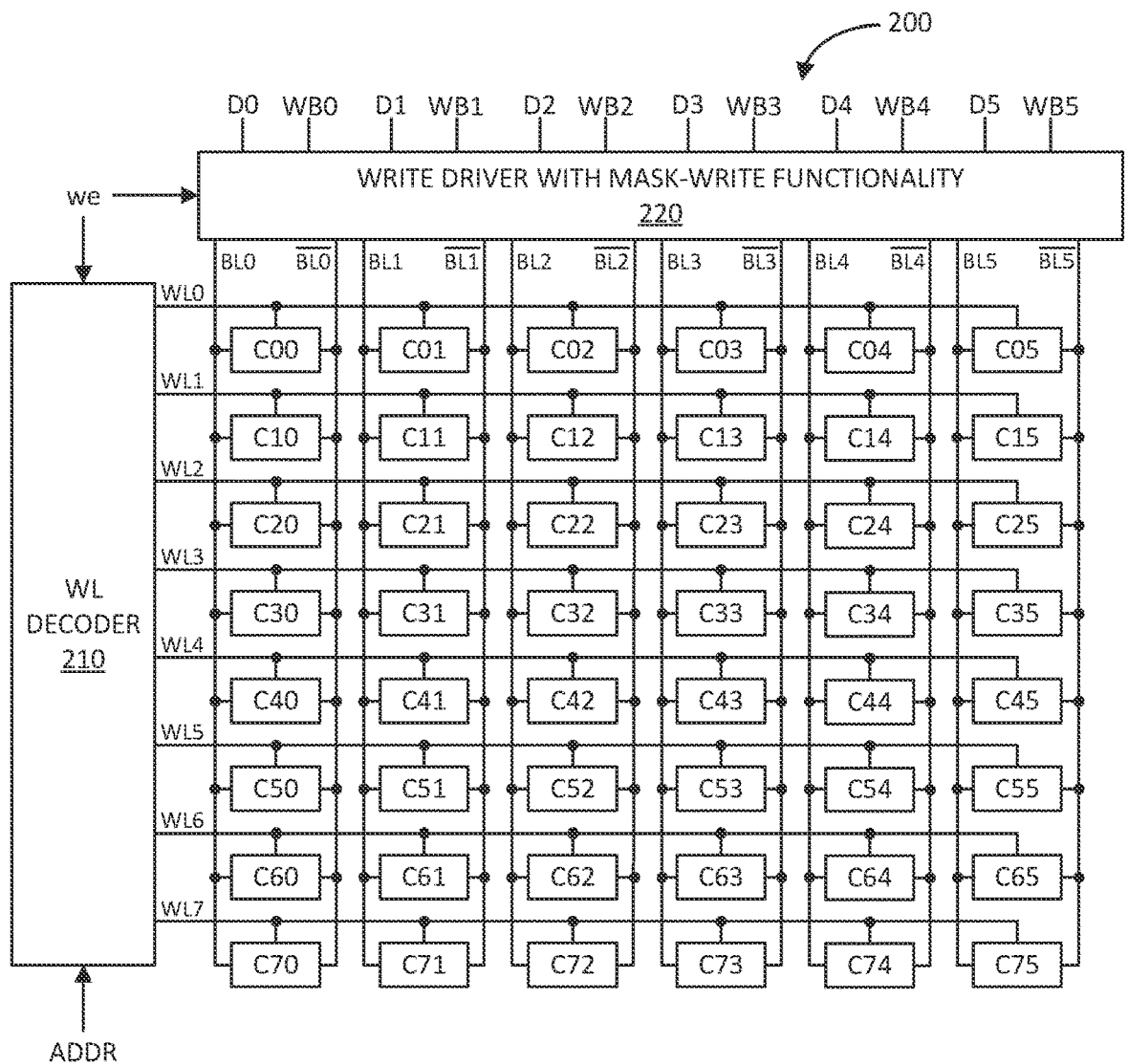
FIG. 2A illustrates a block/schematic diagram of an example memory circuit with mask-write functionality in accordance with another aspect of the disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

FIG. 1A illustrates a block/schematic diagram of an example memory circuit 100 in accordance with an aspect of the disclosure. The memory circuit 100 may be a static random access memory (SRAM) or dynamic random access memory (DRAM) type memory circuit.

In particular, the memory circuit 100 includes a two-dimensional array of memory cells C00 to C75. In this example, the size of the array is eight (8) rows and six (6) columns (e.g., an 8×6 memory array). However, it shall be understood that the size of the memory array including the number of rows and columns may vary depending on application. Memory cells C00-005 to C70-C75 are common to rows zero (0) to seven (7), respectively. Memory cells C00-C70 to C05-C75 are common to columns zero (0) to five (5), respectively. As discussed, each of the memory cells C00 to C75 may be implemented as an SRAM or DRAM cell.

The memory circuit 100 further includes a wordline (WL) decoder 110, a write driver 120, a sense amplifier 130, and a memory buffer 140. The WL decoder 110 includes a first input configured to receive a write enable (we) signal, a second input configured to receive a read enable (re) signal, and a third input configured to receive an address (ADDR). The WL decoder 110 includes a set of outputs coupled to a set of wordlines metallization traces) WL0 to WL7, respectively. The set of wordlines WL0 to WL7 are, in turn, coupled to rows of cells C00-C05 to C70-C75, respectively.

The write driver 120 includes an input configured to receive the write enable (we) signal, and a set of data inputs configured to receive a set of data D0 to D5, respectively. The write driver 120 further includes a set of complementary (e.g., differential) outputs coupled to a set of complementary bitlines (BL) (e.g., metallization traces) BL0/$\overline{BL0}$ to BL5/$\overline{BL5}$, respectively. The set of complementary bitlines BL0/$\overline{BL0}$ to BL5/$\overline{BL5}$, are, in turn, coupled to columns of cells C00-C70 to C05-C75, respectively. It shall be understood that a DRAM memory circuit typically does not include complementary bitlines, just single-ended bitlines.

The sense amplifier 130 (which may also be referred to as a memory read circuit) includes an input configured to receive the read enable (re) signal. The sense amplifier 130 further includes a set of complementary (e.g., differential) inputs coupled to the set of complementary bitlines BL0/$\overline{BL0}$ to BL5/$\overline{BL5}$, respectively. Additionally, the sense amplifier 130 further includes a set of data outputs D0 to D5 coupled to a set of data inputs D0 to D5 of the memory buffer 140, respectively. The memory buffer 140 also includes an input configured to receive the read enable (re) signal, and a set of data outputs D0-D5. The operation of the memory circuit 100 is discussed below with reference to FIGS. 1B-1C.

FIG. 1B illustrates a bit diagram of example data stored in the memory circuit 100 in accordance with another aspect of the disclosure. The horizontal axis of the hit diagram identifies the columns 0-5 of the memory cells. The vertical axis of the bit diagram identifies the rows 0-7 of the memory cells. The array of boxes below and to the right of the column and row identifiers shows the data in the memory cells C00-C75, For example, the first row of cells C00-005 store the data 1, 0, 1, 0, 1, and 0, respectively; the second row of cells C10-C15 store the data 0, 1, 0, 1, 0, and 1, respectively; and so on, in a similar manner. In this example, the writing operation of the memory circuit 100 will focus on the cells C50-C55 in the sixth row coupled to wordline WLS. The data stored in these cells C50-C55 are 0, 1, 0, 1, 0, and 1, respectively.

FIG. 1C illustrates a flow diagram of an example method 150 of writing data into the memory circuit 100 in accordance with another aspect of the disclosure. According to the method 150, the data or word stored in the fifth row of cells C50-C55 are first transferred to the memory buffer 140 (block 160). In this regard, the address provided to the WL decoder 110 points to the sixth row of cells C10-C15, and in response to the read enable (re) signal being asserted, the WL decoder 110 generates an asserted select signal on wordline WL5 (as well as generates deasserted select signals on wordlines WL0-WL4 and WL6-7). The asserted select signal on wordline WL5 selects the memory cells C50-C55 for data reading purpose. Further, in response to the read enable (re) being asserted, the sense amplifier 130 differentially senses the voltage levels at the set of complementary bitlines BL0/$\overline{BL0}$ to BL5/$\overline{BL5}$, respectively. By performing differential sensing and comparison of the complementary bitlines voltages, the sense amplifier 130 generates the data D0-D5. Also, in response to the asserted read enable (re) signal, the memory buffer 140 reads or receives the data D0-D5 from the sense amplifier 130.

Further, according to the data writing method 150, one or more of the data bits D0-D5 in the memory buffer 140 are modified (block 170). As illustrated in FIG. 1B, the hits indicated in the darker shaded boxes are the ones to be modified, and the hits in the lighter shaded boxes are the ones not to be modified. Thus, the data writing method 150 includes modifying the word stored in the memory buffer 140 to change the data 1, 1, 0 stored in memory cells C51, C53, and C54, respectively. Although not explicitly illustrated, the set of data outputs of the memory buffer 140 is coupled to the set of data inputs D0-D5 of the write driver 120, respectively.

Then, according to the data writing method 150, the modified word in the memory buffer 140 is rewritten into memory cells C50-C55, respectively (block 180). In this regard, the address provided to the WL decoder 110 again points to the fifth row of memory cells C50-C55 (e.g., the target memory cells of the writing operation). Then, the write enable (we) signal is asserted, In response to the asserted write enable (we) signal, the WL decoder 110 generates an asserted select signal on wordline coupled to the target memory cells C50-C55 (and generates reasserted select signals on wordlines WL0-WL4 and WL6-7 coupled to the non-target memory cells C00-C45 and C60-C75). The asserted select signal on wordline WL5 selects the target memory cells C50-C55 for data writing purpose.

Also, in response to the write enable (we) signal, the write driver 120 generates complementary bitline signals on the complementary bitlines BL0/$\overline{BL0}$ to BL5/$\overline{BL5}$ based on the data D0-D5 received from the memory buffer 140, respectively. This operation causes the data D0-D5 associated with the modified word (e.g., 000011) to be written into the target memory cells C50-C55, respectively.

There are some drawbacks associated with the memory circuit 100. As discussed, the writing operation of the memory circuit 100 generally involves three (3) primary operations: transfer a word (to which one or more bits need to be overwritten) from a row of memory cells into the memory buffer 140 per block 160; modify the one or more bits of the word stored in the memory buffer 140 per block 170; and then rewrite the modified word back into the row of memory cells per block 180. Thus, the data writing method 150 involves significant latency due to the three (3) required operations. This is even the case where some of the bits of the word need not be modified, such as hits (lighter shaded boxes) stored in memory cells C50, C52, and C54.

FIG. 2A illustrates a block/schematic diagram of an example memory circuit 200 with mask-write functionality in accordance with another aspect of the disclosure. As mentioned, the memory circuit 200 employs mask-write functionality to allow data writing in a single operation as opposed to the three (3) operations previously discussed with respect to memory circuit 200. As discussed in more detail below, the mask-write functionality substantially isolates one or more non-target memory cells of a word from the data operation of one or more target memory cells of the same word.

More specifically, the memory circuit 200 is similar to memory circuit 100; in that, the memory circuit 200 includes a two-dimensional array of memory cells C00-C75, a WL decoder 210 and a write driver 220, and may also include a sense amplifier and memory buffer, although not shown in FIG. 2A for simplicity reasons. Similarly, the array of memory cells C00-C75 are arranged in eight (8) rows C00-C05 to C70-C75 and six (6) columns C00-C70 to C05-C75 (e.g., an 8×6 memory array). Each of the memory cells C00-C75 may be an SRAM or DRAM memory cell.

Also similarly, the WL decoder 210 includes a first input to receive a write enable (we) signal, a second input to receive an address (ADDR) identifying the row of memory cells including one or more cells to which data is to be written, and a set of outputs coupled to wordlines WL0-WL7, respectively. As previously discussed, the set of wordlines WL0 to WL7 are coupled to rows of cells C00-C05 to C70-C75, respectively. In a like manner, the write driver 220 includes an input configured to receive the write enable (we) signal, a set of data inputs configured to receive a set of data D0 to D5, and a set of complementary outputs coupled to a set of complementary bitlines BL0/$\overline{BL0}$ to BL5/$\overline{BL5}$, respectively. As previously mentioned, the set of complementary bitlines BL0/$\overline{BL0}$ to BL5/$\overline{BL5}$, are, in turn, coupled to columns of cells C00-C70 to C05-C75, respectively. As previously discussed, DRAM memory circuits typically do not include complementary bitlines; and thus, each of the DRAM memory cells is coupled to a single-ended bitline The memory circuit 200 differs from memory circuit 100 in that the memory circuit 200, the write driver 220 further includes mask-write functionality. In this regard, the write driver 220 further includes another set of inputs configured to receive a set of write-bits signals WB0 to WB5, which specify the bit(s) of the identified word to be written (or the corollary, which bits, if any, of the selected word to be masked from the data writing operation).

For example, if the memory circuit 200 is an SRAM memory circuit, when writing data '1' to an SRAM cell, the write driver 220 sets the complementary bitlines BL/$\overline{BL}$ to 1/0; when writing data '0' to an SRAM cell, the write driver 220 sets the complementary bitlines BL/$\overline{BL}$ to 0/1; and when the corresponding write-bit (WB) signal is deasserted, the write driver 220 sets the complementary bitlines BL/$\overline{BL}$ to 1/1 to cause the corresponding SRAM cell to retain the previously stored data, If the memory circuit 200 is a DRAM memory circuit, when writing data to a DRAM cell, the write driver 220 sets the bitline BL to '1'; when writing data '0' to a DRAM cell, the write driver 220 sets the bitline BL to '0'; and when the corresponding write-bit (WB) signal is deasserted, the write driver 220 causes the bitline BL to float so that the corresponding DRAM cell retains the previously stored data.

Figure 2B:
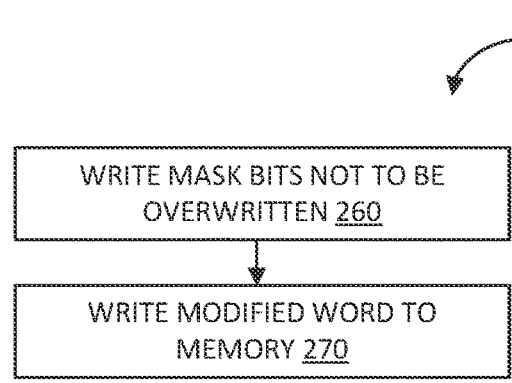
FIG. 2B illustrates a flow diagram of an example method of writing data into the memory circuit of FIG. 2A in accordance with another aspect of the disclosure.

FIG. 2B illustrates a flow diagram of an example method 250 of writing data into the memory circuit 200 in accordance with another aspect of the disclosure. According to the method 250, in response to the write-bit signals identifying bits to be masked from the writing operation, such as bits stored in memory cells C50, C52, and C55 of the memory data example depicted in FIG 1B, and in response to an asserted write-enable signal (we), the write driver 220 generates 1/1 on or floats the bitlines coupled to the memory cells C50, C52, and C55 to which the data writing operation is to be masked (block 260). The write driver 220 also generates the appropriate signals on the bitlines coupled to the memory cells C51, C53, and C54 into which data is to be written.

Simultaneously, the address is provided to the WL decoder 210 which, as discussed, points to target memory cells C50-C55. In response to the asserted write enable (we) signal, the WL decoder 210 generates an asserted select signal on wordline WL5 coupled to the target memory cells C50-C55 (and generates deasserted select signals on wordlines WL0-WL4 and WL6-WL7 coupled to the non-target memory cells C00-C45 and C60-C75). The signals on the wordlines WL0-WL7 and the bitlines BL0/$\overline{BL0}$ to BL5/$\overline{BL5}$ select the target memory cells C51, C53, and C54 for data writing purpose.

Also simultaneously, according to the method 250, in response to the write enable (we) signal, the write driver 220 generates complementary bitline signals on the complementary bitlines BL0/$\overline{BL0}$ to BL5/$\overline{BL5}$ based on new data D1, D3, and D4 and the write-hits WB0, WB2, and WB5. The bits of D0, D2, and D5 are "don't cares" as the corresponding memory cells C50, C52, and C55 are masked due to the deasserted write-bit signals WB0, WB2, and WB5, respectively. The complementary bitline signals on the complementary bitlines BL1/$\overline{BL1}$, BL2/$\overline{BL2}$, and BL4/$\overline{BL4}$ modify the bits stored in target memory cells C51, C53, and C54 (block 270). All of these operations as summarized in blocks 260 and 270 of the data writing method 250 may be performed substantially simultaneously; resulting, in a single writing operation to modify the bits stored in memory cells C51, C53, and C54. Thus, the data writing latency with the mask-write functionality of memory circuit 200 may be substantially smaller compared to the data writing latency associated with the memory circuit 100.

Figure 3:
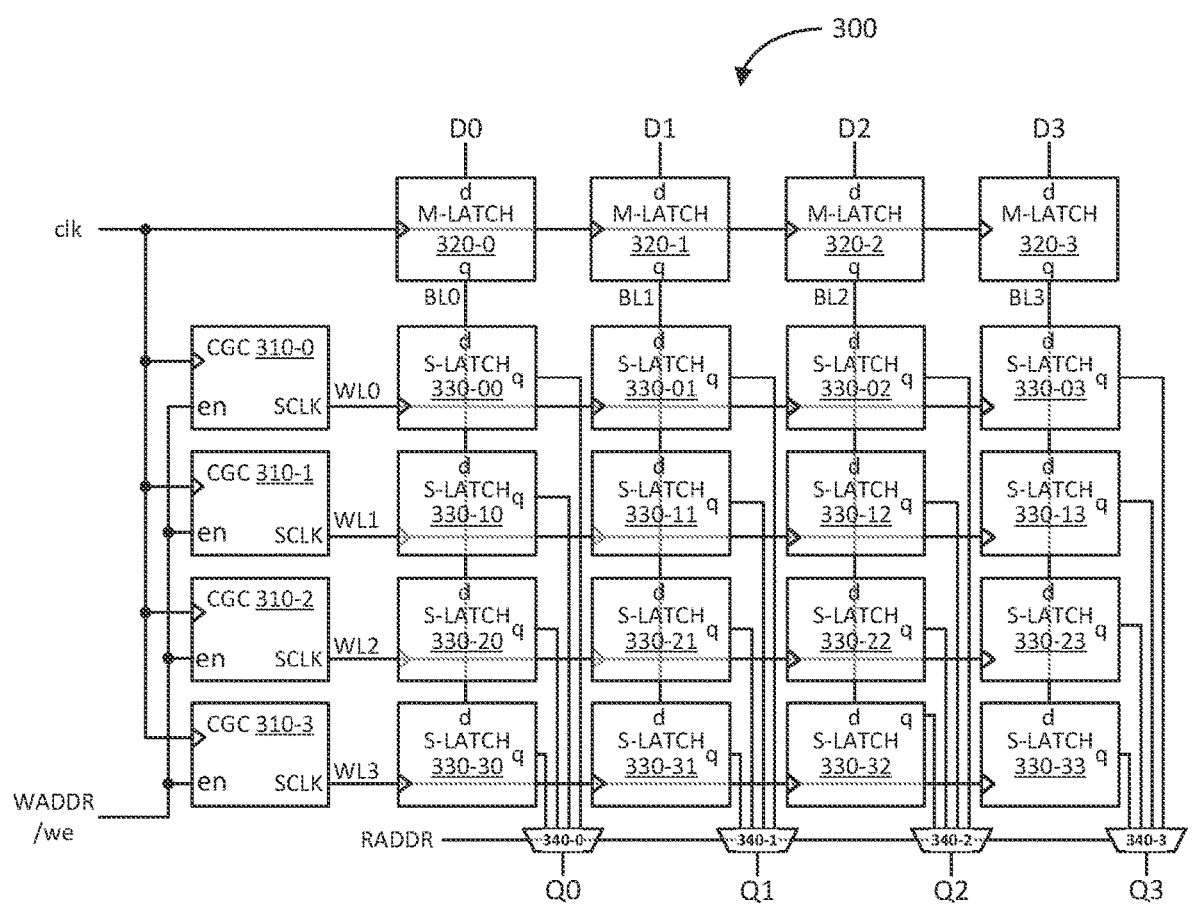
FIG. 3 illustrates a block/schematic diagram of an example latch array in accordance with another aspect of the disclosure.

FIG. 3 illustrates a block/schematic diagram of an example latch array 300 in accordance with another aspect of the disclosure. A latch array is another type of memory circuit that uses latches to store data as opposed to SRAM and DRAM memory cells. Latch arrays used in integrated circuits (ICs), such as system on chips (SOCs), are becoming more popular due to their relatively low power consumption compared to that of SRAM or DRAM memory circuits. Generally, this is because the voltage domain (MX) associated with SRAM and DRAM memory circuits is much higher than the voltage domain (CX) used in logic circuits. As a latch array is built with logic circuits, the latch array may use the lower logic voltage domain (CX) to consume less power compared to SRAM or DRAM memory circuits on the MX voltage domain.

In particular, the latch array 300 includes a set of clock gating circuits (CGCs) 310-0 to 310-3, a set of master latches 320-0 to 320-3, a two-dimensional array of slave latches 330-00 to 330-33, and a set of multiplexers 340-0 to 340-3. In this example, the array of slave latches is arranged in four (4) rows of slave latches 330-00-330-03 to 330-30-330-33, and four (4) columns of slave latches 330-00-330-30 to 330-03-330-33 (e.g., a 4×4 latch array,). Similarly, it shall be understood that the size and dimensions of the latch array 300 may be different depending on the particular application in which it is used.

The set of clock gating circuits (CGCs) 310-0 to 310-3 include a set of clock inputs configured to receive a master clock (clk), respectively. The set of clock gating circuits (CGCs) 310-0 to 310-3 further includes a set of enable inputs configured to receive a write address (WADDR), which may include a write enable (we) signal. In this example, the write address has a length of two bits to uniquely address each of the set of clock gating circuits (CGCs) 310-0 to 310-3. The set of clock gating circuits 310-0 to 310-3 additionally includes a set of slave clock outputs (SCLK) coupled to a set of wordlines WL0 to WL3, respectively. The set of wordlines WL0 to WL3 are coupled to a set of clock inputs of rows of slave hitches 330-00-330-03 to 330-30-330-33, respectively.

The set of master latches 320-0 to 320-3 includes a set of clock inputs configured to receive the master clock clk. Additionally, the set of master latches 320-0 to 320-3 includes a set of data inputs (d) configured to receive a set of data D0 to D3, respectively. Further, the set of master latches 320-0 to 320-3 includes a set of data outputs (q) coupled to a set of bitlines BL0 to BL3, respectively. The set of bitlines BL0 to BL3 are coupled to a set of data inputs (d) of columns of slave latches 330-00-330-30 to 330-03-330-33, respectively.

Each of the set of multiplexers 340-0 to 340-3 include a set of data inputs coupled to a set of data outputs (q) of each of the columns of slave latches 330-00-330-30 to 330-03-330-33, respectively. For clarity, the multiplexer 340-0 includes a set of data inputs coupled to a set of data outputs (q) of slave latches 330-00 to 330-30 of column "0", respectively; the multiplexer 340-1 includes a set of data inputs coupled to a set of data outputs (q) of slave latches 330-01 to 330-31 of column "1", respectively; the multiplexer 340-2 includes a set of data inputs coupled to a set of data outputs (q) of slave latches 330-02 to 330-32 of column "2", respectively; and the multiplexer 340-3 includes a set of data inputs coupled to a set of data outputs (q) of slave latches 330-03 to 330-33 of column "3", respectively. The set of multiplexers 340-0 to 340-3 further includes a set of select inputs configured to receive a read address (RADDR). Additionally, the set of multiplexers 340-0 to 340-3 includes a set of data outputs configured to produce output or read data Q0 to Q3, respectively.

The writing operation of the latch array 300 may be as follows: The write address pointing to the row of slave latches into which data is to be written is provided to the set of clock gating circuits (CGCs) 310-0 to 310-3. In this particular example, the write address points to the third row of slave latches 330-20 to 330-23. Also, the new data D0 to D3 to be written into the third row of slave latches 330-20 to 330-23 are provided to the set of data inputs of the set of master latches 320-0 to 320-3, respectively.

in response to the high phase of the master clock clk, the set of master latches 320-0 to 320-3 become opaque, and the new data D0 to D3 are provided to the set of bitlines BL0 to BL3, respectively. Additionally, in response to the write enable (we) being asserted and the write address pointing to the third row of slave latches 330-20 to 330-23, the clock gating circuit (CGC) 310-2 generates the slave clock sell that is provided to the row of slave latches 330-20 to 330-23 via the wordline WL2. As the other clock gating circuits (CGCs) 310-0, 310-1, and 310-3 are not addressed in this data writing example, these clock gating circuits (CGCs) 310-0, 310-1, and 310-3 do not generate slave clocks sclk on wordlines WL0, WL1, and WL3, respectively.

The slave clock sclk may be substantially 180 degrees out-of-phase with the master clock clk. Accordingly, in response to the low phase of the slave clock sclk, the row of slave latches 330-20 to 330-23 become transparent to accept the new data D0 to D3 on the set of bitlines BL0 to BL3, respectively. The following high phase of the slave clock sclk then causes the row of slave latches 330-20 to 330-23 to become opaque to hold or store the data D0 to D3, respectively. Also, the following low phase of the master clock clk causes the set of master latches 320-0 to 320-3 to become transparent to accept the following new data D0 to D3, respectively.

The read operation of the latch array 300 is straight forward; in that, the read address causes the set of multiplexers 340-0 to 340-3 to output the data stored in a row of slave latches identified by the read address. For example, if the data stored in the third row of slave latches 330-20 to 330-23 is to be read, the read address causes the set of multiplexers 340-0 to 340-3 to select the second inputs from the left, respectively. These inputs of the set of multiplexers 340-0 to 340-3 are coupled to the set of data outputs (q) of the third row of slave latches 330-20 to 330-23, respectively. Accordingly, the data stored in the third row of slave latches 330-20 to 330-23 are produced at output data Q0 to Q3 at the set of outputs of the set of multiplexers 340-0 to 340-3, respectively.

Although, as discussed, the latch array 300 is generally more power efficient than an SRAM or DRAM memory circuit, the latch array 300 does not have mask-write functionality, That is, pursuant to a data write operation as previously discussed, all of the slave latches belonging to a row or wordline are overwritten with the new data D0 to D3 even though some of the data need not be overwritten. For example, assume that the data stored in slave latches 330-21 and 330-22 are to be overwritten with new data D1 and D2, and the data stored in slave latches 330-20 and 330-23 need to remain the same, the write operation of the latch array 330 still requires the same data D0 and D3 to be provided to slave latches 330-20 and 330-23, respectively. In certain situation, the application using the latch array 300 may not know the value of the data not to be overwritten. Thus, in such case, it would be desirable to provide mask-write functionality to a latch array.

Figure 4A:
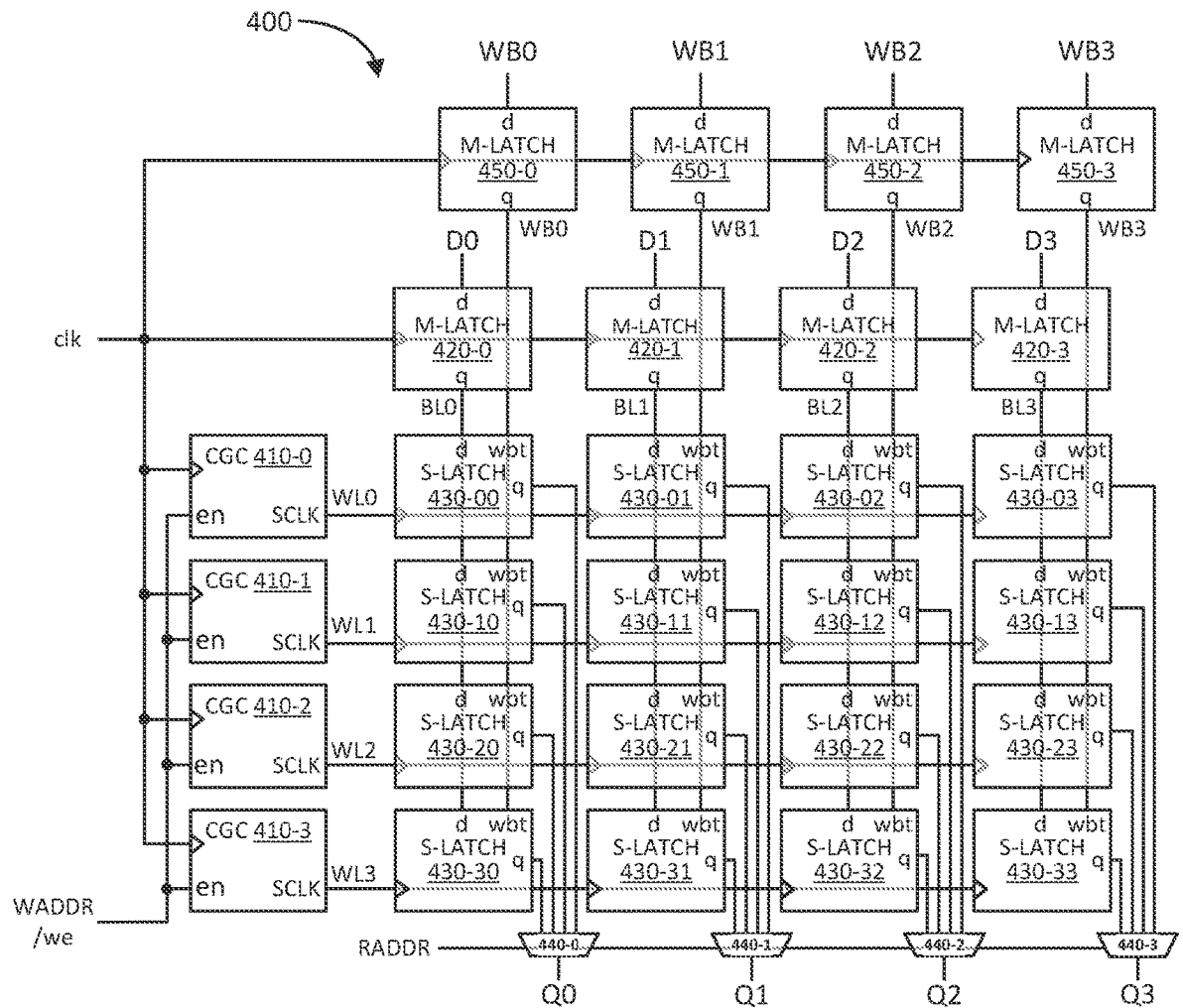
FIG. 4A illustrates a block/schematic diagram of an example latch array with mask-write functionality in accordance with another aspect of the disclosure.

FIG. 4A illustrates a block/schematic diagram of an example latch array 400 with mask-write functionality in accordance with another aspect of the disclosure. In summary the latch array 400 is reconfigured to provide mask-write functionality, as discussed in more detail below. Similar to latch array 300, the latch array 400 is a 4×4 latch array; but it shall be understood that the latch array 400 may be implemented to have different sizes, and the number of rows may be different than the number of columns.

The latch array 400 is similar to latch array 300 in that the latch array 400 includes a set of clock gating circuits (CGCs) 410-0 to 410-3 (including the set of clock inputs configured to receive the master clock clk, the set of inputs configured to receive the write address/write enable (we) signal, and the set of slave clock outputs (SCLK) coupled to the set of wordlines WL0 to WL3, respectively); a first set of master slave latches 420-0 to 420-3 (including the set of clock inputs configured to receive the master clock clk, the set of data inputs (d) configured to receive data D0 to D3 to be written into the latch array 400, and the set of data output (q) coupled to the set of bitlines BL0 to BL3, respectively); the two-dimensional array of slave latches 430-00 to 430-33 with rows of slave latches 430-00-430-03 to 430-30-430-33 including the set of slave clock inputs coupled to the set of wordlines WL0 to WL3 and a set of data outputs (q) coupled to sets of data inputs of the set of multiplexers 440-0 to 440-3, and with columns of slave latches 430-00-430-30 to 430-03-430-33 including the set of data inputs (d) coupled to the set of bitlines BL0 to BL3, respectively.

For mask-write functionality, the latch array 400 further includes a second set of master latches 450-0 to 450-3. The second set of master latches 450-0 to 450-3 includes a set of clock inputs configured to receive the master clock clk, respectively. The second set of master latches 450-0 to 450-3 includes a set of write-bit inputs (d) configured to receive a set of write-bit signals wb0 to wb3, respectively. The second set of master latches 450-0 to 450-3 includes a set of write-bit outputs (q) coupled to a set of write-bit lines WB0 to WB3, respectively. Columns of slave latches 430-00-430-30 to 430-03-430-33 includes a set of write-bit inputs (wbt) coupled to the set of write-bit lines WB0 to WB3,respectively. It shall be understood that in some implementations, the first and second sets of master latches 420-0 to 420-3 and 450-0 to 450-3 can be the same or different. The mask-write operation of the latch array 400 is discussed below with reference to FIG. 4B.

Figure 4B:
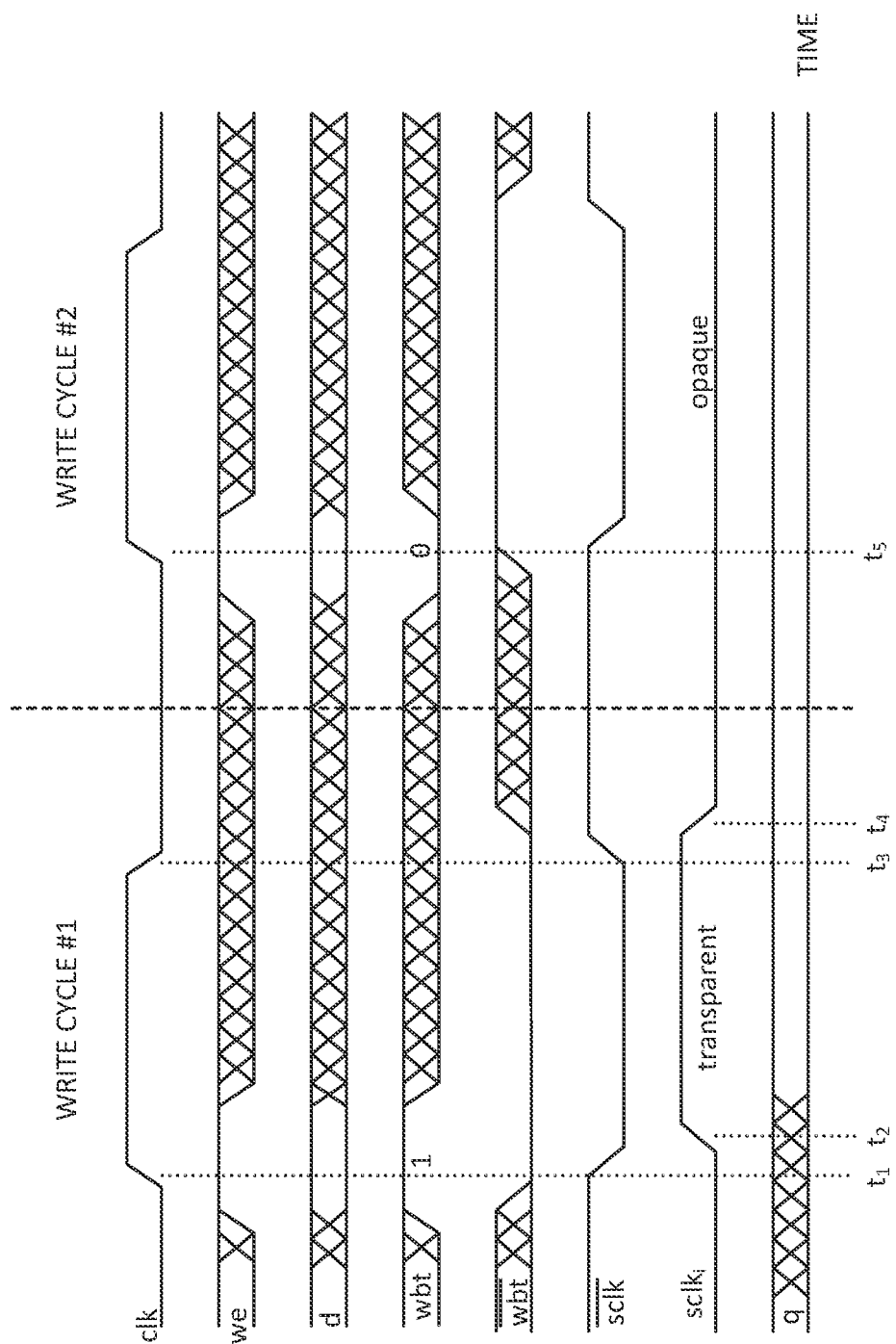
FIG. 4B illustrates a timing diagram of an example data write and write-mask operation performed by the latch array of FIG. 4A in accordance with another aspect of the disclosure.

FIG. 4B illustrates a timing diagram of an example mask-write operation performed by the latch array 400 with respect to a target slave latch in accordance with another aspect of the disclosure. The horizontal axis of the timing diagram represents time. The time axis is divided into two write cycles #1 and #2. The vertical axis represents the logic voltage levels of various signals, such as, from top-to-bottom, the master clock (clk), the write enable signal (we), the data signal (d), the write-bit signal (wbt), the complementary write-bit signal ($\overline{wbt}$), the complementary slave clock ($\overline{sclk}$), an internal non-complementary slave clock $sclk_i$, and the output data signal (q).

In accordance with the first write cycle #1, the write-bit signal (wbt) is asserted at a high logic voltage (1). This means that data will be written into the target slave latch (or the corollary, the target slave latch is not masked). As illustrated, prior to the rising edge of the master clock (clk) at $time_1$ the write enable signal (we) is asserted, the data signal (d) is present at the input of the corresponding master latch of the first set, and the write-bit signal (wbt) is present at the input of the corresponding master latch of the second set. In response to the rising edge of the master clock (clk) at time $t_1$, the corresponding master latch of the first set transfers the data signal (d) onto the corresponding bitline, the corresponding master latch of the second set transfers the complementary write-bit signal ($\overline{wbt}$) (as the master latch of the second set may invert the write-bit signal (wbt)) onto the corresponding write-bit line, and the corresponding clock gating circuit (CGC) generates a falling edge of the complementary slave clock ($\overline{sclk}$) on the corresponding wordline.

As discussed in more detail further herein with reference to various example slave latch implementations, in response to the falling edge of the complementary slave clock ($\overline{sclk}$), the target slave latch generates a rising edge of an internal non-complementary slave clock ($sclk_i$) at time $t_2$. This causes the target slave latch to become transparent, and accept or receive the data signal (d) from the corresponding bitline. Then, in response to the following falling edge of the master clock (clk) at time $t_3$, the corresponding clock gating circuit (CGC) generates a rising edge of the complementary slave clock ($\overline{sclk}$) on the corresponding wordline. In response to the rising edge of the complementary slave clock ($\overline{sclk}$), the target slave latch generates a falling edge of the internal non-complementary slave clock ($sclk_i$) at time $t_4$. This causes the target slave latch to become opaque, and hold or store the data received.

In accordance with the second write cycle #2, the write-bit signal (wbt) is deasserted at a low logic voltage (0). This means that the target slave latch is masked, and will not accept a "don't care" data signal (d) on the corresponding bitline. As illustrated, prior to the rising edge of the master clock at time $t_5$ during the second write cycle #2, the write enable signal (we) is asserted, the "don't care" data signal (d) is present at the input of the corresponding master latch of the first set, and the write-bit signal (wbt) is present at the input of the corresponding master latch of the second set. In response to the rising edge of the master clock (clk) at time $t_5$, the corresponding master latch of the first set transfers the "don't care" data signal (d) onto the corresponding bitline, the corresponding master latch of the second set transfers the complementary write-bit signal ($\overline{wbt}$) onto the corresponding write-bit line, and the corresponding clock gating circuit (CGC) generates a falling edge of the complementary slave clock ($\overline{sclk}$) on the corresponding wordline. However, in this case, in response to the falling edge of the complementary slave clock ($\overline{sclk}$), the target slave latch does not generate the internal non-complementary slave clock ($sclk_i$). This causes the slave latch to remain opaque, and retain the previously stored data.

Figure 5:
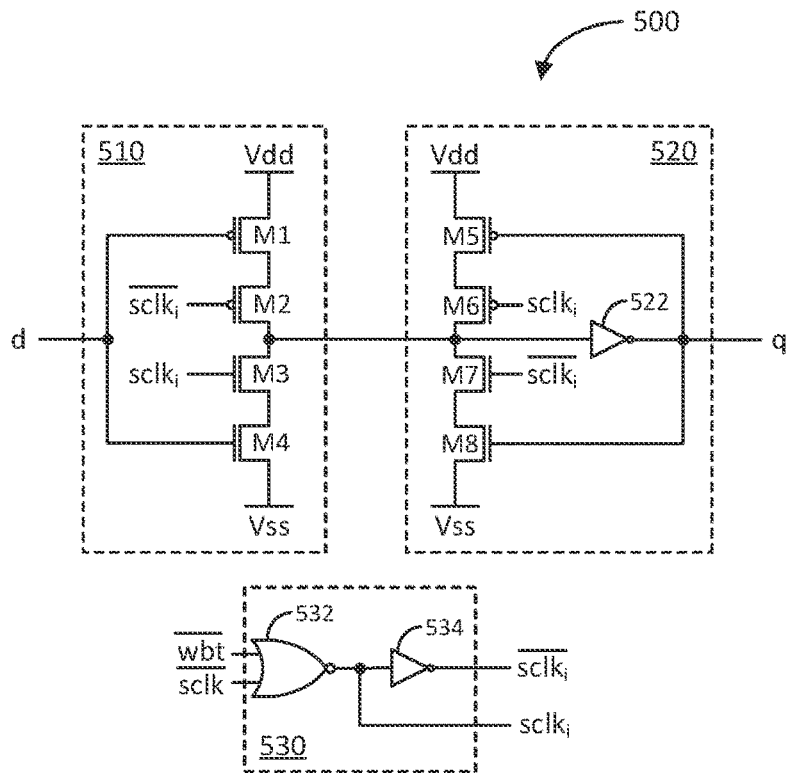
FIG. 5 illustrates a schematic diagram of an example slave latch in accordance with another aspect of the disclosure.

FIG. 5 illustrates a schematic diagram of an example slave latch 500 in accordance with another aspect of the disclosure. The slave latch 500 may be an example implementation of any of the slave latches 430-00 to 430-33 of latch array 400. In summary, the slave latch 500 gates the slave clock $\overline{sclk}$ in response to the write-bit signal wbt being deasserted (meaning write-mask is being applied to the slave latch 500); otherwise, the slave clock $\overline{sclk}$ is passed to a data gating and latching circuitry. In particular, the slave latch 500 includes a data gating circuit 510, a data latching circuit 520, and a clock gating circuit 530.

The clock gating circuit 530 is configured to generate an internal non-complementary slave clock $sclk_i$ and an internal complementary slave clock $\overline{sclk_i}$ in response to the complementary slave clock $\overline{sclk}$ received via a corresponding wordline if the write-bit signal wbt is asserted (e.g., a logic one (1)) (or the complementary write-bit signal $\overline{wbt}$ is a logic zero (0)). The clock gating circuit 530 is further configured to gate the complementary slave clock sclk received via a corresponding wordline if the write-bit signal wbt is deasserted (e.g., a logic zero (0)) (or the complementary write-bit signal $\overline{wbt}$ is a logic one (1)).

More specifically, the clock gating circuit 530 includes a NOR gate 532 including a first input coupled to a corresponding write-bit line to receive the complementary write-bit signal $\overline{wbt}$, a second input coupled to a corresponding wordline to receive the complementary slave clock signal $\overline{sclk}$, and an output configured to produce the internal non-complementary clock signal $sclk_i$. The clock gating circuit 530 further includes an inverter 534 including an input coupled to the output of the NOR gate 532, and an output configured to produce the internal complementary slave clock $\overline{sclk_i}$.

When the slave latch 500 is transparent, the data gating circuit 510 is configured to pass the data signal (d) received via a corresponding bitline to an output of the data gating circuit 510 (and input of the data latching circuit 520). When the slave latch 500 is opaque, the data gating circuit 510 is configured to gate the data signal (d).

More specifically, the data gating circuit 510 includes a first field effect transistor (FET) M1, a second FET M2, a third FET M3, and a fourth FET M4 coupled in series between an upper voltage rail Vdd and a lower voltage rail Vss (e.g., ground). The first and second FETs M1 and M2 may be implemented as p-channel metal oxide semiconductor field effect transistors (PMOS FETs). The third and fourth FETs M3 and M4 may be implemented as n-channel metal oxide semiconductor field effect transistors (NMOS FETs). The gates of the first and fourth FETs M1 and M4 are coupled together, and to a corresponding bitline to receive the data signal (d). The gates of the second and third FETs M2 and M3 are coupled to the outputs of the inverter 534 and NOR gate 532 to receive the internal complementary slave clock $\overline{sclk_i}$ and the internal non-complementary slave clock $sclk_i$, respectively. The output of the data gating circuit 510 is at a node between (e.g., drains of) FETs M2 and M3.

When the slave latch 500 is transparent, the data latching circuit 520 is open to receive the data signal (d) from the output of the data gating circuit 510. When the slave latch 500 is opaque, the data latching circuit 520 is closed to hold the received data (d).

More specifically, the data latching circuit 520 includes a fifth FET M5, a sixth FET M6, a seventh FET M7, and an eighth FET M8 coupled in series between the upper voltage rail Vdd and the lower voltage rail Vss. The fifth and sixth FETs M5 and M6 may be implemented as PMOS FETs. The seventh and eighth FETs M7 and M8 may be implemented as NMOS FETs. The input of the data latching circuit 520 is at a node between (e.g., drains of) FETS M6 and M7, which is the same node as the output of the data gating circuit 510. The gates of the FETs M5 and M8 are coupled together, and to a data output (q) of the slave latch 500, which is coupled to an input of the corresponding multiplexer (e.g., one of multiplexers 440-0 to 440-3), The gates of the FETs M6 and M7 are coupled to the outputs of the NOR gate 532 and inverter 534 to receive the internal non-complementary slave clock $sclk_i$, and the internal complementary slave clock $\overline{sclk_i}$, respectively. The data latching circuit 520 further includes an inverter 522 including an input and output coupled to the input and data output (q) of the data latching circuit 520, respectively.

In operation, when data is to be written into the slave latch 500 (the slave latch is transparent), the complementary write-bit signal $\overline{wbt}$ and the complementary slave clock are both logic low. In response, the clock gating circuit 530 generates the internal non-complementary clock signal $sclk_i$ as a logic high and the internal complementary clock signal $\overline{sclk_i}$ as a logic low. Accordingly, the FETs M2 and M3 of the data gating circuit 510 are on to allow the data signal (d) to pass to the input of the data latching circuit 520. Similarly, the FETs M6 and M7 of the data latching circuit 520 are off; thereby, keeping the data latching circuit 520 open to accept the data signal (d) from the data gating circuit 510.

Data is to be held by the slave latch 500 (the slave latch is opaque) under two conditions: (1) the complementary slave clock $\overline{sclk}$ is logic high; and/or (2) the complementary write-bit signal $\overline{wbt}$ is logic high. Under both conditions, the clock gating circuit 530 generates the internal complementary clock signal $sclk_i$ as a logic low and the internal complementary clock signal $\overline{sclk_i}$ as a logic high. Accordingly, the FETs M2 and M3 of the data gating circuit 510 are off to gate the data signal (d) from passing to the input of the data latching circuit 520, The FETs M6 and M7 of the data latching circuit 520 are on; thereby, closing the data latching circuit 520 to hold the data (q).

Figure 6:
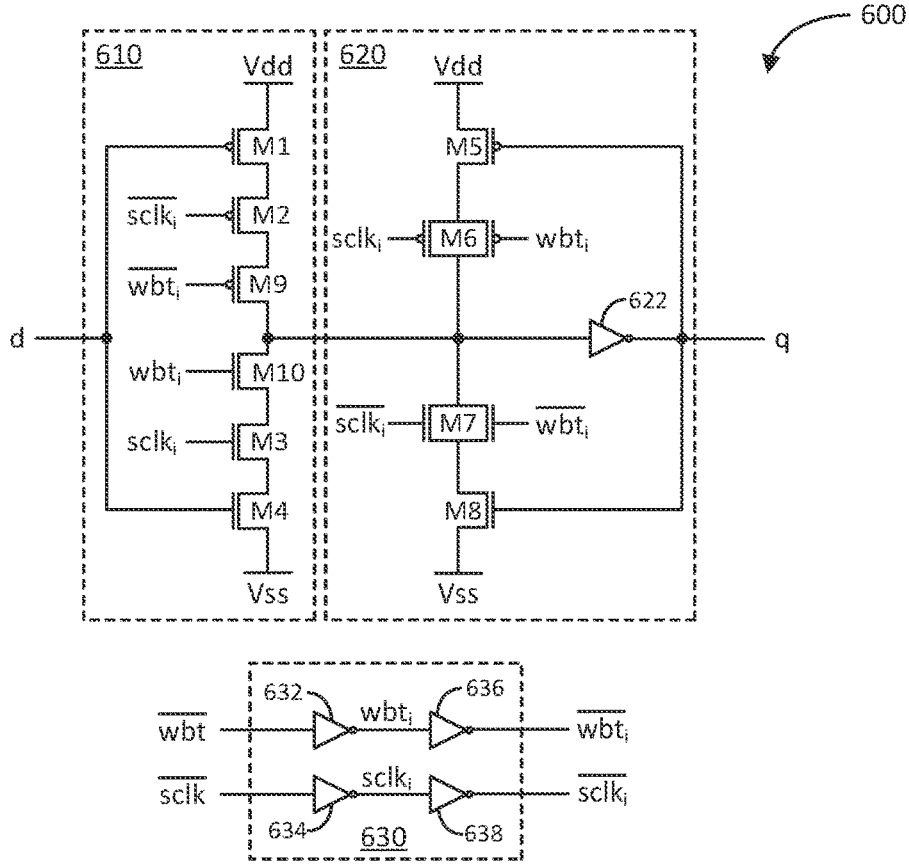
FIG. 6 illustrates a schematic diagram of another example slave latch in accordance with another aspect of the disclosure.

FIG. 6 illustrates a schematic diagram of an example slave latch 600 in accordance with another aspect of the disclosure. The slave latch 600 may be an example implementation of any of the slave latches 430-00 to 430-33 of latch array 400. In summary, the slave latch 600 gates the data signal (d) in response to the write-bit signal wbt being deasserted (meaning write-mask is being applied to the slave latch 600); otherwise, the data signal (d) passes in response to the slave clock $\overline{sclk}$. In particular, the slave latch 600 includes a data gating circuit 610, a data latching circuit 620, and a signal buffer circuit 630.

The signal buffer circuit 630 is configured to generate an internal non-complementary slave clock $sclk_i$ and an internal complementary slave clock $\overline{sclk_i}$ based on a complementary slave clock $\overline{sclk}$ received via a corresponding wordline. The signal buffer circuit 630 is also configured to generate an internal non-complementary write-bit signal $wbt_i$ and an internal complementary write-bit signal $\overline{wbt_i}$ based on a complementary write-bit signal $\overline{wbt}$ received via a corresponding write-bit line.

More specifically, the signal buffer circuit 630 includes a first inverter 632 including an input coupled to a corresponding write-bit line to receive the complementary write-bit signal $\overline{wbt}$, and an output to produce the internal non-complementary write-bit signal $wbt_i$. The signal buffer circuit 630 includes a second inverter 636 including an input coupled to the output of the first inverter 632, and an output to produce the internal complementary write-bit signal $\overline{wbt_i}$. The signal buffer circuit 630 includes a third inverter 634 including an input coupled to a corresponding wordline line to receive the complementary slave clock $\overline{sclk}$, and an output to produce the internal non-complementary slave clock $sclk_i$. The signal buffer circuit 630 includes a fourth inverter 638 including an input coupled to the output of the third inverter 634, and an output to produce the internal complementary slave clock $\overline{sclk_i}$.

When the slave latch 600 is transparent, the data gating circuit 610 is configured to pass the data signal (d) received via a corresponding bitline to an output of the data gating circuit 610 (and input of the data latching circuit 620). When the slave latch 600 is opaque, the data gating circuit 610 is configured to gate the data signal (d).

More specifically, the data gating circuit 610 includes a first FET M1, a second FET M2, a ninth FET M9, a tenth FET M10, a third FET M3, and a fourth FET M4 coupled in series between an upper voltage rail Vdd and a lower voltage rail Vss (e.g., ground). The first, second, and ninth FETs M1, M2, and M9 may be implemented as PMOS FETs. The tenth, third and fourth FETs M10, M3 and M4 may be implemented as NMOS FETs. The gates of the first and fourth FETs M1 and M4 are coupled together, and to a corresponding bitline to receive the data signal (d). The gates of the second and third FETs M2 and M3 are coupled to the outputs of the inverters 638 and 634 to receive the internal complementary slave clock $\overline{sclk}_i$ and the internal non-complementary slave clock $sclk_i$, respectively. The gates of the ninth and tenth FETs M9 and M10 are coupled to the outputs of the inverters 636 and 632 to receive the internal complementary write-bit signal $\overline{wbt}_i$ and the internal non-complementary write-bit signal $wbt_i$, respectively. The output of the data gating circuit 610 is at a node between (e.g., drains of) FETs M9 and M10.

When the slave latch 600 is transparent, the data latching circuit 620 is open to receive the data signal (d) from the output of the data gating circuit 610. When the slave latch 600 is opaque, the data latching circuit 620 is closed to hold the data (q).

More specifically, the data latching circuit 620 includes a fifth FET M5, a first pair of parallel FETs M6, a second pair of parallel FETs M7, and an eighth FET M8 coupled in series between the upper voltage rail Vdd and the lower voltage rail Vss. The fifth FET M5 and the first pair of parallel FETs M6 may be implemented as PMOS FETs. The second pair of parallel FETs M7 and the eighth FET M8 may be implemented as MOS FETs, The input of the data latching circuit 620 is at a node between (e.g., drains of) the first and second pairs of FETs M6 and M7, which is the same node as the output of the data gating circuit 610. The gates of the FETs M5 and M8 are coupled together, and to the data output (q) of the slave latch 600, which is coupled to an input of the corresponding multiplexer (e.g., one of multiplexers 440-0 to 440-3). A first set of gates of the pair FETs M6 and M7 are coupled to the outputs of inverters 634 and 638 to receive the internal non-complementary slave clock $sclk_i$, and the internal complementary slave clock $\overline{sclk}_i$, respectively. A second set of gates of the pair FETs M6 and M7 are coupled to the outputs of inverters 632 and 636 to receive the internal non-complementary write-bit signal $wbt_i$, and the internal complementary write-bit signal $\overline{wbt}_i$, respectively. The data latching circuit 620 further includes an inverter 622 including an input and output coupled to the input and data output (q) of the data latching circuit 620, respectively.

In operation, when data is to be written into the slave latch 600 (the slave latch is transparent), the complementary write-bit signal $\overline{wbt}$ and the complementary slave clock are both logic low. In response, the signal buffer circuit 630 generates the internal non-complementary write-bit signal $wbt_i$ and internal non-complementary clock signal $sclk_i$ as logic highs, and the internal complementary write-bit signal $\overline{wbt}_i$ and internal complementary clock signal $\overline{sclk}_i$ as logic lows. Accordingly, the FETs M2, M9, M10, and M3 of the data gating circuit 610 are on to allow the data signal (d) to pass to the input of the data latching circuit 620. Similarly, the pairs of FETs M6 and M7 of the data latching circuit 620 are off; thereby, keeping the data latching circuit 620 open to accept the data signal (d) from the data gating circuit 610.

Data is to be held by the slave latch 600 (the slave latch is opaque) under two conditions: (1) the complementary slave clock sclk is logic high; and/or (2) the complementary write-bit signal $\overline{wbt}$ is logic high. Under the first condition, the signal buffer circuit 630 generates the internal non-complementary clock signal $sclk_i$ is logic low and the internal complementary clock signal $\overline{sclk}$ is logic high. Accordingly, the FETs M2 and M3 of the data gating circuit 610 are off to gate the data signal (d) from passing to the input of the data latching circuit 620. The pair of FETs M6 and M7 of the data latching circuit 620 are on; thereby, closing the data latching circuit 620 to hold the data (q). Under the second condition, the signal buffer circuit 630 generates the internal non-complementary write-bit signal $wbt_i$ is a logic low and the internal complementary clock signal $\overline{wbt}_i$ is logic high. Accordingly, the FETs M9 and M10 of the data gating circuit 610 are off to gate the data signal (d) from passing to the input of the data latching circuit 620. The pair of FETs M6 and M7 of the data latching circuit 620 are on; thereby, closing the data latching circuit 620 to hold the data (q)

Figure 7:
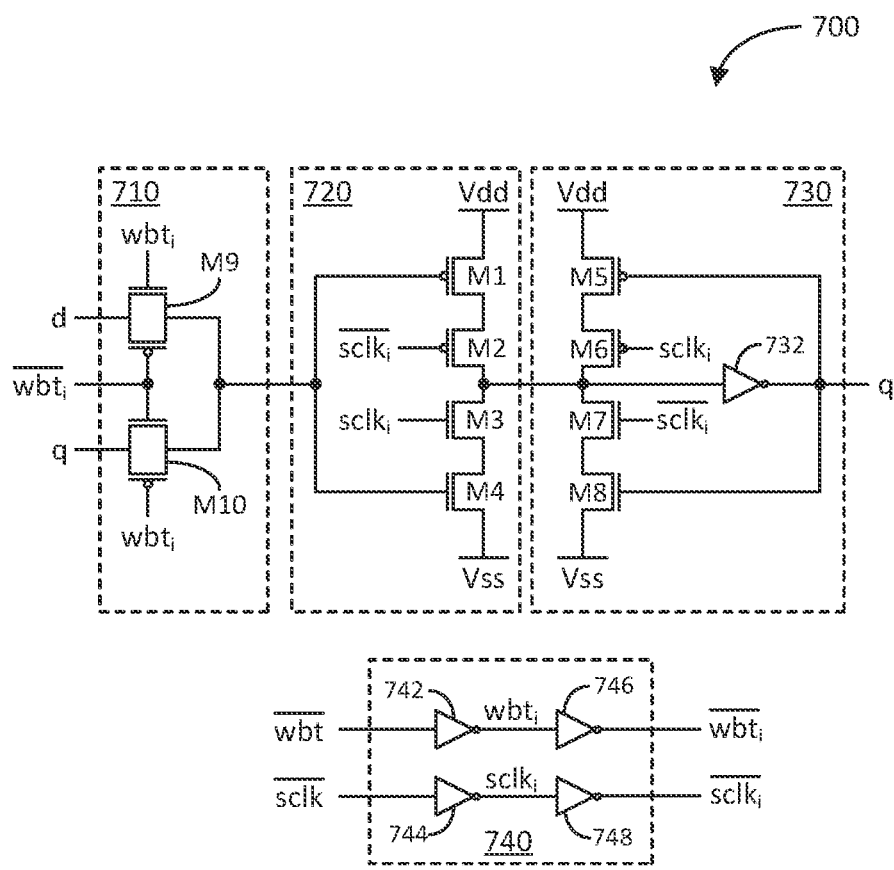
FIG. 7 illustrates a schematic diagram of yet another example slave latch in accordance with another aspect of the disclosure.

FIG. 7 illustrates a schematic diagram of an example slave latch 700 in accordance with another aspect of the disclosure, The slave latch 700 may be an example implementation of any of the slave latches 430-00 to 430-33 of latch array 400. In summary, the slave latch 600 to feedback the data (q) held by the slave latch in response to the write-bit signal wbt being deasserted (meaning write-mask is being applied to the slave latch 700); otherwise, the data signal (d) passes in response to the slave clock $\overline{sclk}$. In particular, the slave latch 700 includes a multiplexer 710 (e.g., 2-to-1 mux), a data gating circuit 720, a data latching circuit 730, and a signal buffer circuit 740.

The signal buffer circuit 740 is configured to generate an internal non-complementary slave clock $sclk_i$ and an internal complementary slave clock $\overline{sclk}_i$ based on a complementary slave clock $\overline{sclk}$ received via a corresponding wordline. The signal buffer circuit 740 is also configured to generate an internal non-complementary write-bit signal $wbt_i$ and an internal complementary write-bit signal $\overline{wbt}_i$ based on a complementary write-bit signal $\overline{wbt}$ received via a corresponding write-bit tine.

More specifically, the signal buffer circuit 740 includes a first inverter 742 including an input coupled to a corresponding write-bit line to receive the complementary write-bit signal $\overline{wbt}$, and an output to produce the internal non-complementary write-bit signal $wbt_i$. The signal buffer circuit 740 includes a second inverter 746 including an input coupled to the output of the first inverter 742, and an output to produce the internal complementary write-bit signal $\overline{wbt}_i$. The signal buffer circuit 740 includes a third inverter 744 including an input coupled to a corresponding wordline line to receive the complementary slave clock $\overline{sclk}$, and an output to produce the internal non-complementary slave clock $sclk_i$. The signal buffer circuit 740 includes a fourth inverter 748 including an input coupled to the output of the third inverter 744, and an output to produce the internal complementary slave clock $\overline{sclk}_i$.

When the write-bit signal wbt is asserted, the multiplexer 710 passes the data signal (d) to the input of the data gating circuit 720, and when the write-bit signal wbt is deasserted, the multiplexer 710 passes the output data signal (q) (previously stored data in the slave latch 700) to the input of the data gating circuit 720.

More specifically, the multiplexer 710 includes a first transmission (pass) gate M9 and a second transmission (pass) gate M10. The first transmission gate M9 includes an input terminal coupled to the corresponding bitline to receive the data signal (d). The first transmission gate M9 further includes non-complementary and complementary gates configured to receive the internal non-complementary and complementary write-bit signals $wbt_i$, and $\overline{wbt_i}$, respectively. The second transmission gate M10 includes an input terminal coupled to the data output (q) of the data latching circuit 730 of the slave latch 700. The second transmission gate M10 further includes complementary and non-complementary gates configured to receive the internal non-complementary and complementary write-bit signals $wbt_i$ and $\overline{wbt_i}$, respectively. The first and second transmission gates M9 and M10 include output terminals coupled together to form an output of the multiplexer 710.

When the slave latch 700 is transparent, the data gating circuit 720 is configured to pass the data signal (d) or (q) from the multiplexer 710 to an output of the data gating circuit 720 (and input of the data latching circuit 730), When the slave latch 700 is opaque, the data gating circuit 720 is configured to gate the data signal (d) or (q).

More specifically, the data gating circuit 720 includes a first FET M1, a second FET M2, a third FET M3, and a fourth FET M4 coupled in series between an upper voltage rail Vdd and a lower voltage rail Vss (e.g., ground). The first and second FETs M1 and M2. may be implemented as PMOS FETs. The third and fourth FETs M3 and M4 may be implemented as NMOS FETs. The gates of the first and fourth FETs M1 and M4 are coupled together, and to the output of the multiplexer 710. The gates of the second and third FETs M2 and M3 are coupled to the outputs of the inverters 748 and 744 to receive the internal complementary slave clock $\overline{sclk_i}$ and the internal non-complementary slave clock $sclk_i$, respectively. The data gating circuit 720 includes an output between (e.g., drains of) FETs M2 and M3.

When the slave latch 700 is transparent, the data latching circuit 730 is open to receive the data signal (d) or (q) from the output of the data gating circuit 720. When the slave latch 700 is opaque, the data latching circuit 730 is closed to hold the data. (q), More specifically, the data latching circuit 730 includes a fifth FET M5, a sixth FET M6, a seventh FET M7, and an eighth FET M8 coupled in series between the upper voltage rail Vdd and the lower voltage rail Vss. The fifth and sixth FETs M5 and M6 may be implemented as PMOS FETs. The seventh and eighth FETs M7 and M8 may be implemented as NMOS FETs. The input of the data latching circuit 730 is at a node between (e.g., drains of) the FETs M6 and M7, which is the same node as the output of the data gating circuit 720. The gates of the FETs M5 and M8 are coupled together, and to the data output (q) of the slave latch 700, which is coupled to an input of the corresponding multiplexer (e.g., one of multiplexers 440-0 to 440-3) and to the input terminal of the second transmission gate M10 of the multiplexer 710. The gates of the FETs M6 and M7 are coupled to the outputs of inverters 744 and 748 to receive the internal non-complementary slave clock $sclk_i$, and the internal complementary slave clock $\overline{sclk_i}$, respectively. The data latching circuit 730 further includes an inverter 732 including an input and output coupled to the input and data output (q) of the data latching circuit 730, respectively.

In operation, new data (d) is to be written into the slave latch 700 (the slave latch is transparent) when the complementary write-bit signal $\overline{wbt}$ and the complementary slave clock are both logic low. In response, the signal buffer circuit 740 generates the internal non-complementary write-bit signal $wbt_i$, and internal non-complementary clock signal $sclk_i$ as logic highs, and the internal complementary write-bit signal $\overline{wbt_i}$ and internal complementary clock signal $\overline{sclk_i}$ as logic lows. Accordingly, the first transmission gate M9 is turned on to pass the data signal (d) to the data gating circuit 720, and the second transmission gate M10 is off to gate the previously stored data (q) in the latch array 700. Additionally, the FETs M2 and M3 of the data gating circuit 720 are on to allow the data. signal (d) to pass to the input of the data latching circuit 730. Similarly, the FETs M6 and M7 of the data latching circuit 730 are off; thereby, keeping the data latching circuit 730 open to accept the data signal (d) from the data gating circuit 720.

The previously stored data (q) is to be written into the slave latch 700 (the slave latch is transparent) when the complementary write-bit signal $\overline{wbt}$ is a logic high and the complementary slave clock is a logic low. In response, the signal buffer circuit 740 generates the internal non-complementary write-bit signal $\overline{wbt}$ and internal non-complementary clock signal $sclk_i$ as logic low and highs, and the internal complementary write-bit signal $\overline{wbt_i}$ and internal complementary clock signal $\overline{sclk_i}$ as logic high and low, respectively. Accordingly, the first transmission gate M9 is turned off to gate the data signal (d), and the second transmission gate M10 is on to pass the previously stored data (q) to the data gating circuit 720. Additionally, the FETs M2 and M3 of the data gating circuit 720 are on to allow the previously stored data (q) to pass to the input of the data latching circuit 730. Similarly, the FETs M6 and M7 of the data latching circuit 730 are off; thereby, keeping the data latching circuit 730 open to accept the previously stored data (q) from the data gating circuit 720.

Data is to be held by the slave latch 700 (the slave latch is opaque) when the complementary slave clock $\overline{sclk}$ is logic high. Under this condition, the signal buffer circuit 740 generates the internal non-complementary clock $sclk_i$ as a logic low and the internal complementary clock signal $\overline{sclk_i}$ as a logic high. Accordingly, the FETs M2 and M3 of the data gating circuit 720 are off to gate the data signal (d) or (q) from passing to the input of the data latching circuit 730. The FETs M6 and M7 of the data latching circuit 730 are on; thereby, closing the data latching circuit 730 to hold the data (q).

Figure 8:
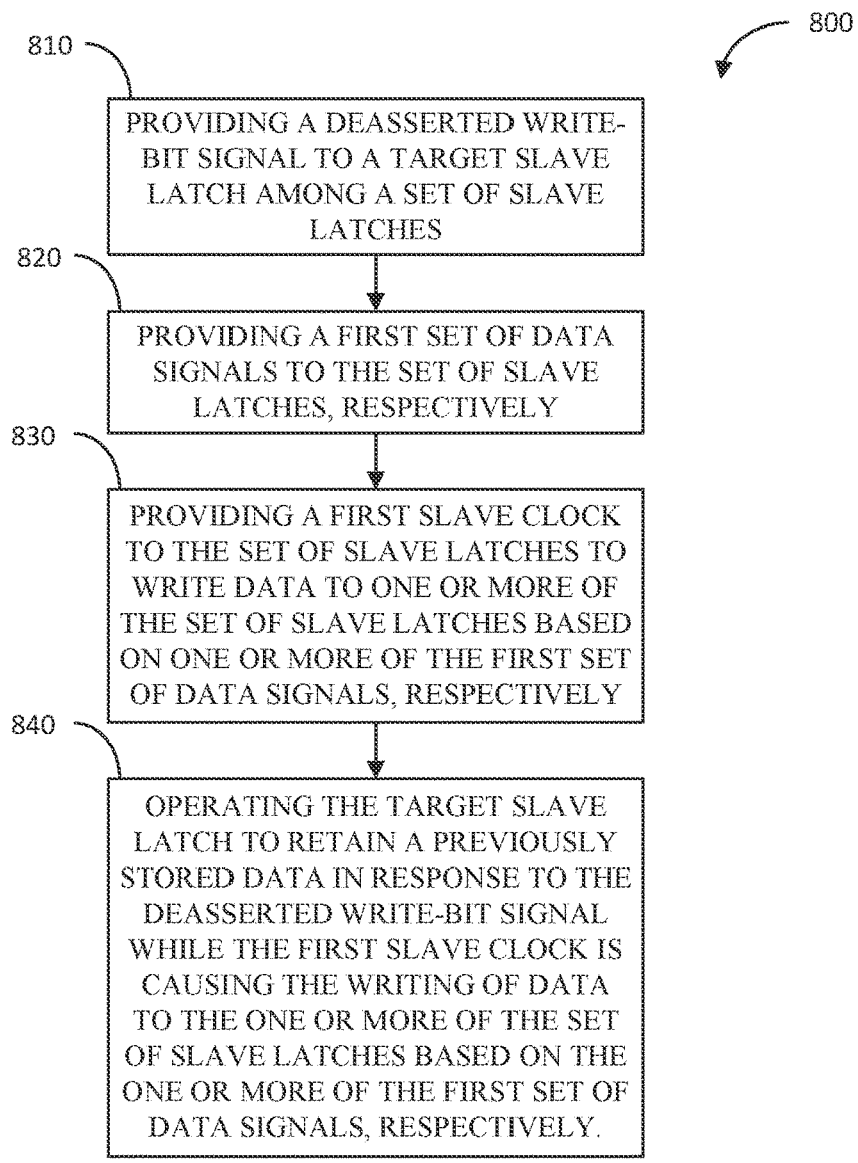
FIG. 8 illustrates a flow diagram of an example method of writing and masking the writing of data to a latch array in accordance with another aspect of the disclosure.

FIG. 8 illustrates a flow diagram of an example method 800 of writing and masking the writing of data to a latch array in accordance with another aspect of the disclosure. The method 800 includes providing a deasserted write-bit signal to a target slave latch among a set of slave latches (block 810). Examples of means for providing a deasserted write-bit signal to a target slave latch among a set of slave latches include any one of the second set of master latches 450-0 to 450-3 coupled to one of the slave latches 430-00 to 430-33 via a corresponding one of the set of write-bit lines WB0 to WB3, respectively.

The method 800 further includes providing a first set of data signals to the set of slave latches, respectively (block 820). Examples of means for providing a first set of data signals to the set of slave latches, respectively, include the first set of master latches 420-0 to 420-3 coupled to columns of slave latches 430-00-430-30 to 430-03-430-33 via the set of bitlines BL0 to BL3, respectively. Additionally, the method 800 includes providing a first slave clock to the set of slave latches to write data to one or more of the set of slave latches based on one or more of the first set of data signals, respectively (block 830). Examples of means for providing a first slave clock to the set of slave latches to write data to one or more of the set of slave latches based on one or more of the first set of data signals, respectively, include a corresponding one of the set of clock gating circuits (CGCs) 410-0 to 410-3 coupled to a corresponding one of the rows of slave latches 430-00-430-03 to 430-30-430-33 via a corresponding one of the set of wordlines WL0 to WL3, respectively.

Additionally, the method 800 includes operating the target slave latch to retain a previously stored data in response to the deasserted write-bit signal while the first slave clock is causing the writing of data to the one or more of the set of slave latches based on the one or more of the first set of data signals, respectively (block 840). Examples of means for operating the target slave latch to retain a previously stored data in response to the deasserted write-bit signal while the first slave clock is causing the writing of data to the one or more of the set of slave latches based on the one or more of the first set of data signals, respectively, include any one of the slave latches 500, 600, and 700 previously discussed.

The operating of the target slave latch of the method 800 may include gating the first slave clock from being applied to the data gating circuit and the data latching circuit in response to the deasserted write-bit signal. An example of means for gating the first slave clock from being applied to the data gating circuit and the data latching circuit in response to the deasserted write-bit signal includes the clock gating circuit 530 of slave latch 500.

The operating of the target slave latch of the method 800 may include maintaining the data gating circuit in a gating state and closing the data latching circuit in response to the deasserted write-bit signal. An example of means for maintaining the data gating circuit in a gating state and closing the data latching circuit in response to the deasserted write-bit signal includes the FETs M9-M10 of the data gating circuit 610 having gates coupled to the outputs of the inverters 636 and 632, respectively; and the pairs of FETs M6-M7 including gates coupled to the outputs of the inverters 632 and 636, respectively.

The operating of the target slave latch of the method 800 may include feeding back the previously stored data from a data output to a data input of the data latching circuit via the data gating circuit in response to the deasserted write-bit signal and the first slave clock. An example of means for feeding hack the previously stored data from a data output to a data input of the data latching circuit via the data gating circuit in response to the deasserted write-bit signal and the first slave clock includes the data latching circuit 730 having a data output (q) coupled to a data input (q) of the multiplexer 710 being responsive to the write-bit signal; the multiplexer 710 including a data output coupled to a data input of the data gating circuit 720; and the data gating circuit 720 including a data output coupled to the data input of the data latching circuit 730.

The method 800 may further include providing an asserted write-bit signal to the target slave latch. Examples of means for providing an asserted write-bit signal to the target slave latch include any one of the second set of master latches 450-0 to 450-3 coupled to one of the slave latches 430-00 to 430-33 via a corresponding one of the set of write-bit lines WB0 to WB3, respectively.

The method 800 may further include providing a second set of data signals to the set of slave latches, respectively. Examples of means for providing a second set of data signals to the set of slave latches, respectively, include the first set of master latches 420-0 to 420-3 coupled to columns of slave latches 430-00-430-30 to 430-03-430-33 via the set of bitlines BL0 to BL3, respectively. Additionally, the method 800 may include providing a second slave clock to the set of slave latches to write data to one or more of the set of slave latches based on one or more of the second set of data signals, respectively. Examples of means for providing a second slave clock to the set of slave latches to write data to one or more of the set of slave latches based on one or more of the second set of data signals, respectively, include a corresponding one of the set of clock gating circuits (CGCs) 410-0 to 410-3 coupled to a corresponding one of the rows of slave latches 430-00-430-03 to 430-30-430-33 via a corresponding one of the set of wordlines WL0 to WL3, respectively.

Additionally, the method 800 may include operating the target slave latch to store data based on the corresponding one of the second set of data signal in response to the asserted write-bit signal and the second slave clock. Examples of means for operating the target slave latch to store data based on the corresponding one of the second set of data signal in response to the asserted write-bit signal and the second slave clock include any one of the slave latches 500, 600, and 700 previously discussed.

The operating of the target slave latch to store the data of the method 800 may include passing the second slave clock to the data gating circuit and the data latching circuit in response to the asserted write-bit signal. An example of means for passing the second slave clock to the data gating circuit and the data latching circuit in response to the asserted write-bit signal includes the clock gating circuit 530 of slave latch 500.

The operating of the target slave latch to store the data of the method 800 may include setting the data gating circuit in a non-gating state and the data latching circuit in an open state in response to the asserted write-bit signal and the second slave clock. An example of means for setting the data gating circuit in a non-gating state and the data latching circuit in an open state in response to the asserted write-bit signal and the second slave clock includes the FETs M9-M10 of the data gating circuit 610 having gates coupled to the outputs of the inverters 636 and 632, respectively; the pairs of FETs M6-M7 including gates coupled to the outputs of the inverters 632 and 636, respectively; the FETs M2-M3 of the data gating circuit 610 having gates coupled to the outputs of the inverters 638 and 634, respectively; the pairs of FETs M6-M7 including gates coupled to the outputs of the inverters 634 and 638, respectively.

The operating of the target slave latch to store the data of the method 800 may include applying the corresponding one of the second set of data signal to the data gating circuit in response to the asserted write-bit signal. An example of means for applying the corresponding one of the second set of data signal to the data gating circuit in response to the asserted write-bit signal includes the multiplexer 710 including an input to receive a data signal (d) and output coupled to the data gating circuit 720, and being responsive to the write-bit signal.

Figure 9:
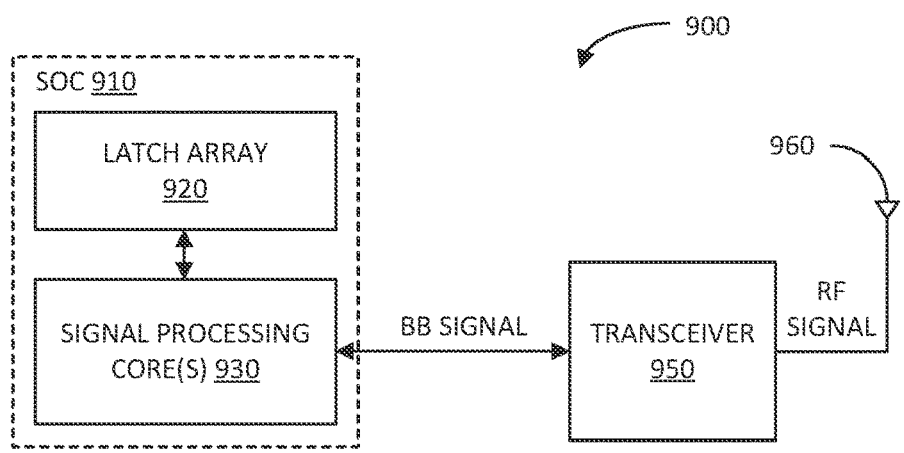
FIG. 9 illustrates a block diagram of an example wireless communication device, in accordance with another aspect of the disclosure.

FIG. 9 illustrates a block diagram of an example wireless communication device 900 in accordance with another aspect of the disclosure. The wireless communication device 900 includes at least one antenna 960 (e.g., an antenna array), a transceiver 950 coupled to the at least one antenna 960, and an integrated circuit (IC) or system on chip (SOC) 910. The IC or SOC 910, in turn, includes a latch array 920, and one or more signal processing cores 930 coupled to the latch array 920. The latch array 920 may be implemented per latch array 400 including any one of the slave latches 500, 600, and 700 previously discussed. The one or more signal processing cores 930 is coupled to the transceiver 950.

Pursuant to a signal transmission application, the one or more signal processing cores 930 may generate a transmit baseband (BB) signal based on data retrieved from the latch array 920. The one or more signal processing cores 930 provides the transmit baseband (BB) signal to the transceiver 950, which, in turn, generates a transmit radio frequency (RF) signal based on the transmit baseband (BB)

signal, The transmit RIF signal is provided to the at least one antenna 960 for wireless transmission to one or more remote wireless devices.

Pursuant to a signal reception application, the at least one antenna 960 is configured to wirelessly receive a received RF signal from one or more remote wireless devices. The transceiver 950 is configured to generate a received baseband (BB) signal in the second voltage domain based on the received RF signal. The one or more signal processing cores 930 may be configured to process the received baseband (BB) signal to generate data. The one or more signal processing cores 930 may store the data in the latch array 920.

The following provides an overview of aspects of the present disclosure:

Aspect 1: A latch array, including: a first set of master latches including a first set of clock inputs configured to receive a master clock, a first set of data inputs configured to receive a first set of data, and a first set of data outputs coupled to a set of bitlines, respectively; a second set of master latches including a second set of clock inputs configured to receive the master clock, a first set of write-bit inputs configured to receive a set of write-bit signals, and a set of write-bit outputs coupled to a set of write-bit lines, respectively; and an array of slave latches arranged into columns and rows, wherein the slave latches in the columns of the array include a second set of data inputs coupled to the set of bitlines, and a second set of write-bit inputs coupled to the set of write-bit lines, respectively.

Aspect 2: The latch array of aspect 1, further including a set of clock gating circuits including a third set of clock inputs configured to receive the master clock, and a set of clock outputs coupled to a set of wordlines, wherein the slave latches in the rows of the array include a fourth set of clock inputs coupled to the set of wordlines, respectively.

Aspect 3: The latch array of aspect 2, wherein each slave latch of the array includes: a clock gating circuit including one of the second set of write-bit inputs coupled to one of the set of write-bit lines, one of the fourth set of clock inputs coupled to one of the set of wordlines, and complementary clock outputs; a data gating circuit including one of the second set of data inputs coupled to one of the set of bitlines, a first set of complementary clock inputs coupled to the complementary clock outputs of the clock gating circuit, respectively, and a first data output; and a data latching circuit including a second set of complementary clock inputs coupled to the complementary clock outputs of the clock gating circuit, respectively, a data input coupled to the first data output of the data gating circuit, and a second data output.

Aspect 4: The latch array of aspect 2, wherein each slave latch of the array includes: a clock gating circuit, including: a NOR gate including a first input serving as one of the second set of write-bit inputs coupled to one of the set of write-bit lines, a second input serving as one of the fourth set of clock inputs coupled to one of the set of wordlines, and an output; and a first inverter including an input coupled to the output of the NOR gate. and an output; a data gating circuit, including: a first field effect transistor (FET) including a first gate serving as one of the second set of data inputs coupled to one of the set of bitlines; a second FET including a second gate coupled to the output of the first inverter; a third FET including a third gate coupled to the output of the NOR gate; and a fourth FET including a fourth gate coupled to the first gate of the first FET, wherein the first, second, third, and fourth FETs are coupled in series between first and second voltage rails; and a data latching circuit, including: a fifth FET including a fifth gate coupled to an output of the data latching circuit; a sixth FET including a sixth gate coupled to the output of the NOR gate; a seventh FET including a seventh gate coupled to the output of the first inverter; an eighth FET including an eighth gate coupled to the fifth gate of the fifth FET, wherein the fifth, sixth, seventh, and eighth FETs are coupled in series between the first and second voltage rails; and a second inverter including an input coupled to a node between the sixth and seventh FETs, and an output coupled to the output of the data latching circuit.

Aspect 5: The latch array of aspect 4, wherein the first, second, fifth, and sixth FETs are p-channel metal oxide semiconductor field effect transistors (PMOS FETs), respectively, and the third, fourth, seventh, and eighth FETs are n-channel metal oxide semiconductor field effect transistors (NMOS FETs), respectively.

Aspect 6: The latch array of aspect 2, wherein each slave latch of the array includes: a data gating circuit coupled to one of the second set of data inputs coupled to one of the set of bitlines, to one of the fourth set of clock inputs coupled to one of the set of wordlines, and to one of the second set of write-bit inputs coupled to one of the set of write-bit lines, wherein the data gating circuit includes a first data output; and a data latching circuit coupled to the one of the fourth set of clock inputs and to the one of the second set of write-bit inputs, wherein the data latching circuit includes a data input coupled to the first data output of the data gating circuit, and a second data output.

Aspect 7: The latch array of aspect 2, wherein each slave latch of the array includes: a signal buffer circuit, including: a first inverter including an input serving as one of the fourth set of clock inputs coupled to one of the wordlines, and an output; a second inverter including an input coupled to the output of the first inverter, and an output; a third inverter including an input serving as one of the second set of write-bit inputs coupled to one of the set of write-bit lines, and an output; and a fourth inverter including an input coupled to the output of the third inverter, and an output; a data gating circuit, including: a first field effect transistor (FET) including a first gate coupled to one of the second set of data inputs coupled to one of the set of bitlines; a second FET including a second gate coupled to the output of the second inverter; a third FET including a third gate coupled to the output of the fourth inverter; a fourth FET including a fourth gate coupled to the output of the third inverter; a fifth FET including a fifth gate coupled to the output of the first inverter; a sixth FET including a sixth gate coupled to the first gate of the first FET, wherein the first, second, third, fourth, fifth, and sixth FETs are coupled in series between first and second voltage rails; and a data latching circuit, including: a seventh FET including a seventh gate coupled to an output of the data latching circuit; a first pair of parallel FETs including gates coupled to the outputs of the first and third inverters, respectively; a second pair of parallel FETs including gates coupled to the outputs of the second and fourth inverters, respectively; an eighth FET including an eighth gate coupled to the seventh gate of the seventh FET, wherein the seventh FET, the first pair of parallel FETs, the second pair of parallel FETs, and the eighth FET are coupled in series between the first and second voltage rails; and a fifth inverter including an input coupled to a node between the first and second pairs of parallel FETs, and an output coupled to the output of the data latching circuit.

Aspect 8: The latch array of aspect 7, wherein the first, second, third, seventh, and first pair of parallel FETs include p-channel metal oxide semiconductor field effect transistors (PMOS FETs), respectively, and wherein the fourth, fifth, sixth, eighth, and second pair of parallel FETs include n-channel metal oxide semiconductor field effect transistors (NMOS FETs), respectively.

Aspect 9: The latch array of aspect 2, wherein each slave latch of the array includes: a multiplexer including one of the second set of data inputs coupled to one of the set of bitlines, one of the second set of write-bit inputs coupled to one of the set of write-bit lines, a first data input, and a first data output; a data gating circuit including a second data input coupled to the first data output of the multiplexer, and a second data output, wherein the data gating circuit is coupled to one of the fourth set of clock inputs coupled to one of the set of wordlines; and a data latching circuit coupled to the one of the fourth set of clock inputs, wherein the data latching circuit includes a third data input coupled to the second data output of the data gating circuit, and a third data output coupled to the first data input of the multiplexer.

Aspect 10: The latch array of aspect 2, wherein each slave latch of the array includes: a signal buffer circuit, including: a first inverter including an input serving as one of the fourth set of clock inputs coupled to one of the wordlines, and an output; a second inverter including an input coupled to the output of the first inverter, and an output; a third inverter including an input serving as one of the second set of write-bit inputs coupled to one of the set of write-bit lines, and an output; and a fourth inverter including an input coupled to the output of the third inverter, and an output; a multiplexer, including: a first transmission gate including a first terminal coupled to one of the second set of data inputs coupled to one of the set of bitlines, a first set of complementary gates coupled to the outputs of the third and fourth inverters, respectively, and a second terminal; and a second transmission gate including a third terminal, a second set of complementary gates coupled to the outputs of the third and fourth inverters, respectively, and a fourth terminal coupled to the second terminal to form an output; and a data gating circuit, including: a first field effect transistor (FET) including a first gate coupled to the output of the multiplexer; a second FET including a second gate coupled to the output of the second inverter; a third FET including a third gate coupled to the output of the first inverter; and a fourth FET including a fourth gate coupled to the first gate of the first FET, wherein the first, second, third, and fourth FETs are coupled in series between first and second voltage rails; and a data latching circuit, including: a fifth FET including a fifth gate coupled to an output of the data latching circuit; a sixth FET including a sixth gate coupled to the output of the first inverter; a seventh FET including a seventh gate coupled to the output of the second inverter; an eighth FET including an eighth gate coupled to the fifth gate of the fifth FET, wherein the fifth, sixth, seventh, and eighth FETs are coupled in series between the first and second voltage rails; and a fifth inverter including an input coupled to a node between the sixth and seventh FETs, and an output coupled to the output of the data latching circuit, wherein the output of the data latching circuit s coupled to the third terminal of the second transmission gate.

Aspect 11: The latch array of aspect 10, wherein the first, second, fifth, and sixth FETs include p-channel metal oxide semiconductor field effect transistors (PMOS FETs), respectively, and wherein the third, fourth, seventh, and eighth FETs include n-channel metal oxide semiconductor field effect transistors (NMOS FETs), respectively.

Aspect 12: The latch array of any one of aspects 2-11, wherein the set of clock gating circuits includes a set of enable inputs configured to receive a write address.

Aspect 13: The latch array of any one of aspects 1-12, further including a set of multiplexers including sets of inputs coupled to a second set of data outputs of the columns of slave latches, respectively, a set of select inputs configured to receive a read address, and a third set of data outputs configured to produce a second set of data, respectively.

Aspect 14: A method, including: providing a deasserted write-bit signal to a target slave latch among a set of slave latches; providing a first set of data signals to the set of slave latches, respectively; providing a first slave clock to the set of slave latches to write data to one or more of the set of slave latches based on one or more of the first set of data signals, respectively; and operating the target slave latch to retain a previously stored data in response to the deasserted write-bit signal while the first slave clock is causing the writing of data to the one or more of the set of slave latches based on the one or more of the first set of data signals, respectively.

Aspect 15: The method of aspect 14, wherein the target slave latch includes a data gating circuit and a data latching circuit, wherein operating the target slave latch includes gating the first slave clock from being applied to the data gating circuit and the data latching circuit in response to the deasserted write-bit signal.

Aspect 16: The method of aspect 14, wherein the target slave latch includes a data gating circuit and a data latching circuit, wherein operating the target slave latch includes maintaining the data gating circuit in a gating state and closing the data latching circuit in response to the deasserted write-bit signal.

Aspect 17: The method of aspect 14, wherein the target slave latch includes a data gating circuit and a data latching circuit, wherein operating the target slave latch includes feeding back the previously stored data from a data output to a data input of the data latching circuit via the data gating circuit in response to the deasserted write-bit signal and the first slave clock.

Aspect 18: The method of any one of aspects 14-17, further including: providing an asserted write-bit signal to the target slave latch; providing a second set of data signals to the set of slave latches, respectively; providing a second slave clock to the set of slave latches to write data to at least the target slave latch based on a corresponding one of the second set of data signals, respectively; and operating the target slave latch to store data based on the corresponding one of the second set of data signal in response to the asserted write-bit signal and the second slave clock.

Aspect 19: The method of aspect 18, wherein the target slave latch includes a data gating circuit and a data latching circuit, wherein operating the target slave latch to store the data includes passing the second slave clock to the data gating circuit and the data latching circuit in response to the asserted write-bit signal.

Aspect 20: The method of aspect 18, wherein the target slave latch includes a data gating circuit and a data latching circuit, wherein operating the target slave latch to store the data includes setting the data gating circuit in a non-gating state and the data latching circuit in an open state in response to the asserted write-bit signal and the second slave clock.

Aspect 21: The method of aspect 18, wherein the target slave latch includes a data gating circuit and a data latching circuit, wherein operating the target slave latch to store the data includes passing the corresponding one of the second set of data signal to the data gating circuit in response to the asserted write-bit signal.

Aspect 22: An apparatus, including: means for providing a deasserted write-bit signal to a target slave latch among a set of slave latches; means for providing a first set of data signals to the set of slave latches, respectively; means for providing a first slave clock to the set of slave latches to write data to one or more of the set of slave latches based on one or more of the first set of data signals, respectively; and means for operating the target slave latch to retain a previously stored data in response to the deasserted write-bit signal while the first slave clock is causing the writing of data to the one or more of the set of slave latches based on the one or more of the first set of data signals, respectively.

Aspect 23: The apparatus of aspect 22, wherein the target slave latch includes a data gating circuit and a data latching circuit, wherein the means for operating the target slave latch includes means for gating the first slave clock from being applied to the data gating circuit and the data latching circuit in response to the deasserted write-bit signal.

Aspect 24: The apparatus of aspect 22, wherein the target slave latch includes a data gating circuit and a data latching circuit, wherein the means for operating the target slave latch includes means for maintaining the data gating circuit in a gating state and the data latching circuit in a closed state in response to the deasserted write-bit signal.

Aspect 25: The apparatus of aspect 22, wherein the target slave latch includes a data gating circuit and a data latching circuit, wherein the means for operating the target slave latch includes means for feeding back the previously stored data from a data output to a data input of the data latching circuit via the data gating circuit in response to the deasserted write-bit signal and the first slave clock.

Aspect 26: The apparatus of any one of aspects 22-25, further including: means for providing an asserted write-bit signal to the target slave; means for providing a second set of data signals to the set of slave latches, respectively; means for providing a second slave clock to the set of slave latches to write data to at least the target slave latch based on a corresponding one of the second set of data signals, respectively; and means for operating the target slave latch to store data based on the corresponding one of the second set of data signal in response to the asserted write-bit signal and the second slave clock.

Aspect 27: The apparatus of aspect 26, wherein the target slave latch includes a data gating circuit and a data latching circuit, wherein the means for operating the target slave latch to store the data includes passing the second slave clock to the data gating circuit and the data latching circuit in response to the asserted write-bit signal.

Aspect 28: The apparatus of aspect 26, wherein the target slave latch includes a data gating circuit and a data latching circuit, wherein the means for operating the target slave latch to store the data includes means for setting the data gating circuit in a non-gating state and the data latching circuit in an open state in response to the asserted write-bit signal and the second slave clock.

Aspect 29: The apparatus of aspect 26 wherein the target slave latch includes a data gating circuit and a data latching circuit, wherein the means for operating the target slave latch to store the data includes means for passing the corresponding one of the second set of data signal to the data gating circuit in response to the asserted write-bit signal.

Aspect 30: A wireless communication device, including: at least one antenna; a transceiver coupled to the at least one antenna; one or more signal processing cores coupled to the transceiver; and a latch array coupled to the one or more signal processing cores, wherein the latch array includes: a first set of master latches including a first set of clock inputs configured to receive a master clock, a first set of data inputs configured to receive a set of data, respectively, and a first set of data outputs coupled to a set of bitlines, respectively; a second set of master latches including a second set of clock inputs configured to receive the master clock, a first set of write-bit inputs configured to receive a set of write-bit signals, and a set of write-bit outputs coupled to a set of write-bit lines, respectively; and an array of slave latches arranged into columns and rows, wherein the slave latches in the columns of the array include a second set of data inputs coupled to the set of bitlines, and a second set of write-bit inputs coupled to the set of write-bit lines, respectively.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. A latch array, comprising:
    a first set of master latches including a first set of clock inputs configured to receive a master clock, a first set of data inputs configured to receive a set of data, and a first set of data outputs coupled to a set of bitlines, respectively;
    a second set of master latches including a second set of clock inputs configured to receive the master clock, a first set of write-bit inputs configured to receive a set of write-bit signals, and a set of write-bit outputs coupled to a set of write-bit lines, respectively;
    an array of slave latches arranged into columns and rows, wherein the slave latches in the columns of the array include a second set of data inputs coupled to the set of bitlines, and a second set of write-bit inputs coupled to the set of write-bit lines, respectively, wherein each slave latch of the array comprises:
        a clock gating circuit including one of the second set of write-bit inputs coupled to one of the set of write-bit lines, one of the fourth set of clock inputs coupled to one of the set of wordlines, and complementary clock outputs,
        a data gating circuit including one of the second set of data inputs coupled to one of the set of bitlines, a first set of complementary clock inputs coupled to the complementary clock outputs of the clock gating circuit, respectively, and a first data output, and
        a data latching circuit including a second set of complementary clock inputs coupled to the complementary clock outputs of the clock gating circuit, respectively, a data input coupled to the first data output of the data gating circuit, and a second data output and
    a set of clock gating circuits including a third set of clock inputs configured to receive the master clock, and a set of clock outputs coupled to a set of wordlines, wherein the slave latches in the rows of the array include a fourth set of clock inputs coupled to the set of wordlines, respectively.

2. The latch array of claim 1, wherein the set of clock gating circuits includes a set of enable inputs configured to receive a write address.

3. The latch array of claim 1, further comprising a set of multiplexers including sets of inputs coupled to a second set of data outputs of the columns of slave latches, respectively, a set of select inputs configured to receive a read address, and a third set of data outputs configured to produce a second set of data, respectively.

4. A latch array, comprising:
a first set of master latches including a first set of clock inputs configured to receive a master clock, a first set of data inputs configured to receive a set of data, and a first set of data outputs coupled to a set of bitlines, respectively;
a second set of master latches including a second set of clock inputs configured to receive the master clock, a first set of write-bit inputs configured to receive a set of write-bit signals, and a set of write-bit outputs coupled to a set of write-bit lines, respectively;
an array of slave latches arranged into columns and rows, wherein the slave latches in the columns of the array include a second set of data inputs coupled to the set of bitlines, and a second set of write-bit inputs coupled to the set of write-bit lines, respectively; and
a set of clock gating circuits including a third set of clock inputs configured to receive the master clock, and a set of clock outputs coupled to a set of wordlines, wherein the slave latches in the rows of the array include a fourth set of clock inputs coupled to the set of wordlines, respectively,
wherein each slave latch of the array comprises:
a clock gating circuit, comprising:
a NOR gate including a first input serving as one of the second set of write-bit inputs coupled to one of the set of write-bit lines, a second input serving as one of the fourth set of clock inputs coupled to one of the set of wordlines, and an output; and
a first inverter including an input coupled to the output of the NOR gate, and an output;
a data gating circuit, comprising:
a first field effect transistor (FET) including a first gate serving as one of the second set of data inputs coupled to one of the set of bitlines;
a second FET including a second gate coupled to the output of the first inverter;
a third FET including a third gate coupled to the output of the NOR gate; and
a fourth FET including a fourth gate coupled to the first gate of the first FET, wherein the first, second, third, and fourth FETs are coupled in series between first and second voltage rails; and
a data latching circuit, comprising:
a fifth FET including a fifth gate coupled to an output of the data latching circuit;
a sixth FET including a sixth gate coupled to the output of the NOR gate;
a seventh FET including a seventh gate coupled to the output of the first inverter;
an eighth FET including an eighth gate coupled to the fifth gate of the fifth FET, wherein the fifth, sixth, seventh, and eighth FETs are coupled in series between the first and second voltage rails; and
a second inverter including an input coupled to a node between the sixth and seventh FETs, and an output coupled to the output of the data latching circuit.

5. The latch array of claim 4, wherein the first, second, fifth, and sixth FETs are p-channel metal oxide semiconductor field effect transistors (PMOS FETs), respectively, and the third, fourth, seventh, and eighth FETs are n-channel metal oxide semiconductor field effect transistors (NMOS FETs), respectively.

6. A latch array, comprising:
a first set of master latches including a first set of clock inputs configured to receive a master clock, a first set of data inputs configured to receive a set of data, and a first set of data outputs coupled to a set of bitlines, respectively;
a second set of master latches including a second set of clock inputs configured to receive the master clock, a first set of write-bit inputs configured to receive a set of write-bit signals, and a set of write-bit outputs coupled to a set of write-bit lines, respectively;
an array of slave latches arranged into columns and rows, wherein the slave latches in the columns of the array include a second set of data inputs coupled to the set of bitlines, and a second set of write-bit inputs coupled to the set of write-bit lines, respectively; and
a set of clock gating circuits including a third set of clock inputs configured to receive the master clock, and a set of clock outputs coupled to a set of wordlines, wherein the slave latches in the rows of the array include a fourth set of clock inputs coupled to the set of wordlines, respectively,
wherein each slave latch of the array comprises:
a data gating circuit coupled to one of the second set of data inputs coupled to one of the set of bitlines, to one of the fourth set of clock inputs coupled to one of the set of wordlines, and to one of the second set of write-bit inputs coupled to one of the set of write-bit lines, wherein the data gating circuit includes a first data output; and
a data latching circuit coupled to the one of the fourth set of clock inputs and to the one of the second set of write-bit inputs, wherein the data latching circuit includes a data input coupled to the first data output of the data gating circuit, and a second data output.

7. A latch array, comprising:
a first set of master latches including a first set of clock inputs configured to receive a master clock, a first set of data inputs configured to receive a set of data, and a first set of data outputs coupled to a set of bitlines, respectively;
a second set of master latches including a second set of clock inputs configured to receive the master clock, a first set of write-bit inputs configured to receive a set of write-bit signals, and a set of write-bit outputs coupled to a set of write-bit lines, respectively;
an array of slave latches arranged into columns and rows, wherein the slave latches in the columns of the array include a second set of data inputs coupled to the set of bitlines, and a second set of write-bit inputs coupled to the set of write-bit lines, respectively; and
a set of clock gating circuits including a third set of clock inputs configured to receive the master clock, and a set of clock outputs coupled to a set of wordlines, wherein the slave latches in the rows of the array include a fourth set of clock inputs coupled to the set of wordlines, respectively,
wherein each slave latch of the array comprises:
a signal buffer circuit, comprising:
a first inverter including an input serving as one of the fourth set of clock inputs coupled to one of the wordlines, and an output;
a second inverter including an input coupled to the output of the first inverter, and an output;
a third inverter including an input serving as one of the second set of write-bit inputs coupled to one of the set of write-bit lines, and an output; and a fourth inverter including an input coupled to the output of the third inverter, and an output;
a data gating circuit, comprising:
a first field effect transistor (FET) including a first gate coupled to one of the second set of data inputs coupled to one of the set of bitlines;
a second FET including a second gate coupled to the output of the second inverter;
a third FET including a third gate coupled to the output of the fourth inverter;
a fourth FET including a fourth gate coupled to the output of the third inverter;
a fifth FET including a fifth gate coupled to the output of the first inverter;
a sixth FET including a sixth gate coupled to the first gate of the first FET, wherein the first, second, third, fourth, fifth, and sixth FETs are coupled in series between first and second voltage rails; and
a data latching circuit, comprising:
a seventh FET including a seventh gate coupled to an output of the data latching circuit;
a first pair of parallel FETs including gates coupled to the outputs of the first and third inverters, respectively;
a second pair of parallel FETs including gates coupled to the outputs of the second and fourth inverters, respectively;
an eighth FET including an eighth gate coupled to the seventh gate of the seventh FET, wherein the seventh FET, the first pair of parallel FETs, the second pair of parallel FETs, and the eighth FET are coupled in series between the first and second voltage rails; and
a fifth inverter including an input coupled to a node between the first and second pairs of parallel FETs, and an output coupled to the output of the data latching circuit.

8. The latch array of claim 7, wherein the first, second, third, seventh, and first pair of parallel FETs comprise p-channel metal oxide semiconductor field effect transistors (PMOS FETs), respectively, and wherein the fourth, fifth, sixth, eighth, and second pair of parallel FETs comprise n-channel metal oxide semiconductor field effect transistors (NMOS FETs), respectively.

9. A latch array, comprising:
a first set of master latches including a first set of clock inputs configured to receive a master clock, a first set of data inputs configured to receive a set of data, and a first set of data outputs coupled to a set of bitlines, respectively;
a second set of master latches including a second set of clock inputs configured to receive the master clock, a first set of write-bit inputs configured to receive a set of write-bit signals, and a set of write-bit outputs coupled to a set of write-bit lines, respectively;
an array of slave latches arranged into columns and rows, wherein the slave latches in the columns of the array include a second set of data inputs coupled to the set of bitlines, and a second set of write-bit inputs coupled to the set of write-bit lines, respectively; and
a set of clock gating circuits including a third set of clock inputs configured to receive the master clock, and a set of clock outputs coupled to a set of wordlines, wherein the slave latches in the rows of the array include a fourth set of clock inputs coupled to the set of wordlines, respectively,
wherein each slave latch of the array comprises:
a multiplexer including one of the second set of data inputs coupled to one of the set of bitlines, one of the second set of write-bit inputs coupled to one of the set of write-bit lines, a first data input, and a first data output;
a data gating circuit including a second data input coupled to the first data output of the multiplexer, and a second data output, wherein the data gating circuit is coupled to one of the fourth set of clock inputs coupled to one of the set of wordlines; and
a data latching circuit coupled to the one of the fourth set of clock inputs, wherein the data latching circuit includes a third data input coupled to the second data output of the data gating circuit, and a third data output coupled to the first data input of the multiplexer.

10. A latch array, comprising:
a first set of master latches including a first set of clock inputs configured to receive a master clock, a first set of data inputs configured to receive a set of data, and a first set of data outputs coupled to a set of bitlines, respectively;
a second set of master latches including a second set of clock inputs configured to receive the master clock, a first set of write-bit inputs configured to receive a set of write-bit signals, and a set of write-bit outputs coupled to a set of write-bit lines, respectively;
an array of slave latches arranged into columns and rows, wherein the slave latches in the columns of the array include a second set of data inputs coupled to the set of bitlines, and a second set of write-bit inputs coupled to the set of write-bit lines, respectively; and
a set of clock gating circuits including a third set of clock inputs configured to receive the master clock, and a set of clock outputs coupled to a set of wordlines, wherein the slave latches in the rows of the array include a fourth set of clock inputs coupled to the set of wordlines, respectively,
wherein each slave latch of the array comprises:
a signal buffer circuit, comprising:
a first inverter including an input serving as one of the fourth set of clock inputs coupled to one of the wordlines, and an output;
a second inverter including an input coupled to the output of the first inverter, and an output;
a third inverter including an input serving as one of the second set of write-bit inputs coupled to one of the set of write-bit lines, and an output; and
a fourth inverter including an input coupled to the output of the third inverter, and an output;
a multiplexer, comprising:
a first transmission gate including a first terminal coupled to one of the second set of data inputs coupled to one of the set of bitlines, a first set of complementary gates coupled to the outputs of the third and fourth inverters, respectively, and a second terminal; and
a second transmission gate including a third terminal, a second set of complementary gates coupled to the outputs of the third and fourth inverters, respectively, and a fourth terminal coupled to the second terminal to form an output; and
a data gating circuit, comprising:
a first field effect transistor (FET) including a first gate coupled to the output of the multiplexer;
a second FET including a second gate coupled to the output of the second inverter;

a third FET including a third gate coupled to the output of the first inverter; and a fourth FET including a fourth gate coupled to the first gate of the first FET, wherein the first, second, third, and fourth FETs are coupled in series between first and second voltage rails; and a data latching circuit, comprising:
a fifth FET including a fifth gate coupled to an output of the data latching circuit;
a sixth FET including a sixth gate coupled to the output of the first inverter;
a seventh FET including a seventh gate coupled to the output of the second inverter;
an eighth FET including an eighth gate coupled to the fifth gate of the fifth FET, wherein the fifth, sixth, seventh, and eighth FETs are coupled in series between the first and second voltage rails; and
a fifth inverter including an input coupled to a node between the sixth and seventh FETs, and an output coupled to the output of the data latching circuit, wherein the output of the data latching circuit is coupled to the third terminal of the second transmission gate.

11. The latch array of claim 10, wherein the first, second, fifth, and sixth FETs comprise p-channel metal oxide semiconductor field effect transistors (PMOS FETs), respectively, and wherein the third, fourth, seventh, and eighth FETs comprise n-channel metal oxide semiconductor field effect transistors (NMOS FETs), respectively.

12. A method, comprising:
providing a deasserted write-bit signal to a target slave latch among a set of slave latches;
providing a first set of data signals to the set of slave latches, respectively;
providing a first slave clock to the set of slave latches to write data to one or more of the set of slave latches based on one or more of the first set of data signals, respectively; and
operating the target slave latch to retain a previously stored data in response to the deasserted write-bit signal while the first slave clock is causing the writing of data to the one or more of the set of slave latches based on the one or more of the first set of data signals, respectively.

13. The method of claim 12, wherein the target slave latch comprises a data gating circuit and a data latching circuit, wherein operating the target slave latch comprises gating the first slave clock from being applied to the data gating circuit and the data latching circuit in response to the &asserted write-bit signal.

14. The method of claim 12, wherein the target slave latch comprises a data gating circuit and a data latching circuit, wherein operating the target slave latch comprises maintaining the data gating circuit in a gating state and the data latching circuit in a closed state in response to the deasserted write-bit signal.

15. The method of claim 12, wherein the target slave latch comprises a data gating circuit and a data latching circuit, wherein operating the target slave latch comprises feeding back the previously stored data from a data output to a data input of the data latching circuit via the data gating circuit in response to the &asserted write-bit signal and the first slave clock.

16. The method of claim 12, further comprising:
providing an asserted write-bit signal to the target slave latch;
providing a second set of data signals to the set of slave latches, respectively;
providing a second slave clock to the set of slave latches to write data to at least the target slave latch based on a corresponding one of the second set of data signals, respectively; and
operating the target slave latch to store data based on the corresponding one of the second set of data signal in response to the asserted write-bit signal and the second slave clock.

17. The method of claim 16, wherein the target slave latch comprises a data gating circuit and a data latching circuit, wherein operating the target slave latch to store the data comprises passing the second slave clock to the data gating circuit and the data latching circuit in response to the asserted write-bit signal.

18. The method of claim 16, wherein the target slave latch comprises a data gating circuit and a data latching circuit, wherein operating the target slave latch to store the data comprises setting the data gating circuit in a non-gating state and the data latching circuit in an open state in response to the asserted write-bit signal and the second slave clock.

19. The method of claim 16, wherein the target slave latch comprises a data gating circuit and a data latching circuit, wherein operating the target slave latch to store the data comprises passing the corresponding one of the second set of data signal to the data gating circuit in response to the asserted write-bit signal.

20. An apparatus, comprising:
means for providing a deasserted write-bit signal to a target slave latch among a set of slave latches;
means for providing a first set of data signals to the set of slave latches, respectively;
means for providing a first slave clock to the set of slave latches to write data to one or more of the set of slave latches based on one or more of the first set of data signals, respectively; and
means for operating the target slave latch to retain a previously stored data in response to the deasserted write-bit signal while the first slave clock is causing the writing of data to the one or more of the set of slave latches based on the one or more of the first set of data signals, respectively.

21. The apparatus of claim 20, wherein the target slave latch comprises a data gating circuit and a data latching circuit, wherein the means for operating the target slave latch comprises means for gating the first slave clock from being applied to the data gating circuit and the data latching circuit in response to the deasserted write-bit signal.

22. The apparatus of claim 20, wherein the target slave latch comprises a data gating circuit and a data latching circuit, wherein the means for operating the target slave latch comprises means for maintaining the data gating circuit in a gating state and the data latching circuit in a closed state in response to the deasserted write-bit signal.

23. The apparatus of claim 20, wherein the target slave latch comprises a data gating circuit and a data latching circuit, wherein the means for operating the target slave latch comprises means for feeding back the previously stored data from a data output to a data input of the data latching circuit via the data gating circuit in response to the deasserted write-bit signal and the first slave clock.

24. The apparatus of claim 20, further comprising:
means for providing an asserted write-bit signal to the target slave latch;
means for providing a second set of data signals to the set of slave latches, respectively;

means for providing a second slave clock to the set of slave latches to write data to at least the target slave latch based on a corresponding one of the second set of data signals, respectively; and means for operating the target slave latch to store data based on the corresponding one of the second set of data signal in response to the asserted write-bit signal and the second slave clock.

25. The apparatus of claim 24, wherein the target slave latch comprises a data gating circuit and a data latching circuit, wherein the means for operating the target slave latch to store the data comprises means for passing the second slave clock to the data gating circuit and the data latching circuit in response to the asserted write-bit signal.

26. The apparatus of claim 24, wherein the target slave latch comprises a data. gating circuit and a data latching circuit, wherein the means for operating the target slave latch to store the data comprises means for setting the data gating circuit in a non-gating state and the data latching circuit in an open state in response to the asserted write-bit signal and the second slave clock.

27. The apparatus of claim 24, wherein the target slave latch comprises a data gating circuit and a data latching circuit, wherein the means for operating the target slave latch to store the data comprises means for passing the corresponding one of the second set of data signal to the data gating circuit in response to the asserted write-bit signal.

\* \* \* \* \*